(12) United States Patent
Brown et al.

(10) Patent No.: US 11,856,877 B2
(45) Date of Patent: Dec. 26, 2023

(54) ELECTRICAL CONTACTS FOR NANOPARTICLE NETWORKS

(71) Applicant: The University of Canterbury, Christchurch (NZ)

(72) Inventors: Simon Anthony Brown, Christchurch (NZ); Edoardo Galli, Christchurch (NZ); Susant Kumar Acharya, Christchurch (NZ)

(73) Assignee: The University of Canterbury, Christchurch (NZ)

( * ) Notice: Subject to any disclaimer, the term of this patent is extended or adjusted under 35 U.S.C. 154(b) by 302 days.

(21) Appl. No.: 17/132,778

(22) Filed: Dec. 23, 2020

(65) Prior Publication Data

US 2021/0193921 A1    Jun. 24, 2021

(51) Int. Cl.
  *H01L 45/00*    (2006.01)
  *H10N 70/00*    (2023.01)
  *G03F 7/00*    (2006.01)
  *G06N 3/065*    (2023.01)

(52) U.S. Cl.
  CPC ............. *H10N 70/841* (2023.02); *G03F 7/70* (2013.01); *H10N 70/011* (2023.02); *G06N 3/065* (2023.01)

(58) Field of Classification Search
  CPC ..................... H10N 70/841; H10N 70/823
  See application file for complete search history.

(56) References Cited

U.S. PATENT DOCUMENTS

| | | | |
|---|---|---|---|
| 5,706,404 A | 1/1998 | Colak | |
| 7,398,259 B2 | 7/2008 | Nugent | |
| 7,426,501 B2 | 9/2008 | Nugent | |
| 7,494,907 B2 | 2/2009 | Brown et al. | |
| 7,902,857 B1 | 3/2011 | Pino | |
| 8,003,173 B2 | 8/2011 | Choi et al. | |
| 8,275,728 B2 | 9/2012 | Pino | |
| 8,332,340 B2 | 12/2012 | Snider | |
| 8,401,297 B1 | 3/2013 | Apostolos et al. | |
| 9,079,017 B2 | 7/2015 | Taylor et al. | |
| 9,650,245 B2 | 5/2017 | Tsutsui | |
| 2003/0092214 A1 | 5/2003 | Klauk et al. | |
| 2006/0083376 A1 | 4/2006 | Kawamoto et al. | |
| 2006/0258132 A1 | 11/2006 | Brown et al. | |
| 2008/0078441 A1 | 4/2008 | Poplavskyy et al. | |

(Continued)

FOREIGN PATENT DOCUMENTS

WO  86/06547 A1  11/1986
WO  2009/075694 A1  6/2009

(Continued)

OTHER PUBLICATIONS

Schmelzer et al: 'Finite-Size Effects in the Conductivity of Cluster Assembled Nanostructures', Phys. Rev. Lett. 88, 226802—Published May 17, 2002, DOI:10.1103/PhysRevLett.88.226802.

(Continued)

*Primary Examiner* — Mark V Prenty
(74) *Attorney, Agent, or Firm* — MICHAEL BEST & FRIEDRICH LLP

(57) ABSTRACT

A lithographically fabricated electrode comprises a continuous metal film; and a discontinuous metal film. The discontinuous metal film has a first edge proximal to the continuous metal film, and a second edge distal the continuous metal film.

17 Claims, 23 Drawing Sheets

(56) References Cited

U.S. PATENT DOCUMENTS

| | | | |
|---|---|---|---|
| 2009/0046857 | A1 | 2/2009 | Nambu et al. |
| 2010/0243472 | A1 | 9/2010 | Yang et al. |
| 2010/0277232 | A1 | 11/2010 | Snider |
| 2010/0280629 | A1 | 11/2010 | Jung et al. |
| 2010/0315153 | A1 | 12/2010 | Oksanen et al. |
| 2011/0106742 | A1 | 5/2011 | Pino |
| 2012/0016829 | A1 | 1/2012 | Snider |
| 2012/0217994 | A1 | 8/2012 | Pino et al. |
| 2012/0259804 | A1 | 10/2012 | Brezzo et al. |
| 2013/0188863 | A1 | 7/2013 | Linderman et al. |
| 2014/0035614 | A1 | 2/2014 | Pickett |
| 2014/0214738 | A1 | 7/2014 | Pickett |
| 2021/0193921 | A1* | 6/2021 | Brown ............ H10N 70/823 |

FOREIGN PATENT DOCUMENTS

| | | |
|---|---|---|
| WO | 2009/113993 A1 | 9/2009 |
| WO | 2017/003303 A1 | 1/2017 |

OTHER PUBLICATIONS

Fostner, et al: 'Neuromorphic behavior in percolating nanoparticle films', Physical Review E, 92, (2015), 052134-1 to 052134-11, DOI: 10.1103/PhysRevE.92.052134.

Van Lith et al: 'A hydrogen sensor based on tunnelling between palladium clusters', Nanostructure Engineering Science and Technology (NEST) Group and MacDiarmid Institute for Advanced Materials and Nanotechnology, Rutherford Building, University of Canterbury, Christchurch 8140, New Zealand, Applied Phys. Lett. 91, 181910 (2007) https://doi.org/10.1063/1.2802730.

Stieg, et al: 'Neuromorphic Atomic Switch Networks', Plos ONE, vol. 7, issue 8, Aug. 2012.

Fostner, et al: 'Continuum percolation with tunneling', Physical Review B 89, (2014), 075402-1 to 075402-4, DOI: 10.1103/PhysRevB.89.075402.

Shirai, et al: 'Supplementary Materials: Long-range temporal correlations in scale-free neuromorphic networks', Network Neuroscience, (2020), 4(2), 432-447. https://doi.org/10.1162/netn_a_00128.

Indiveri, et al: 'Integration of nanoscale memristor synapses in neuromorphic computing architectures', published Feb. 27, 2013.

Jo et al: 'Nanoscale Memristor Device as Synapse in Neuromorphic Systems', Nano Lett, (2010), 10(4), pp. 1297-1301.

Sattar et al: 'Quantized Conductance and Switching in Percolating Nanoparticle Films', Physical Review Letters, 111, Sep. 26, 2013, pp. 136808-1 to 136808-5. Fig. 1a and the associated text.

Lassesson, et al: 'Electrical characterization of gold island films: A route to control of nanoparticle deposition', Applied Physics Letters 93, 203111 (2008), DOI: 10.1063/1.3027463.

Brown, et al: 'Nanoscale Electronic Devices & Fabrication Methods'. U.S. Pat. No. 7,494,907 B2; granted Feb. 24, 2009; S. A. Brown and J. Schmelzer, jr., 'Nanoscale Electronic Devices & Fabrication Methods'. NZ Patent Application No. 513637; granted Jun. 8, 2004.

Pike et al: 'Atomic Scale Dynamics Drive Brain-like Avalanches in Percolating Nanostructured Networks', Nano Lett. (2020), 20, 3935-3942.

Bose, et al: 'Synaptic dynamics in complex self-assembled nanoparticle networks', Faraday Discuss., (2019), 213, 471-485, DOI: 10.1039/c8fd00109j.

Shirai et al: 'Long-range temporal correlations in scale-free neuromorphic networks', Network Neuroscience (2020); 4(2): 432-447. doi: https://doi.org/10.1162/netn_a_00128.

Bose, et al: 'Stable Self-Assembled Atomic-Switch Networks for Neuromorphic Applications', IEEE Transactions on Electron Devices, vol. 64, No. 12, Dec. 2017, 5194-5201.

Mallinson et al: 'Avalanches and criticaly in self-organized nanoscale networks', Applied Sciences and Engineering, Sci. Adv., 5(11), Nov. 1, 2019, DOI: 10.1126/sciadv.aaw8438.

Minnai et al: 'Facile fabrication of complex networks of memristive devices', (2017), Scientific Reports, 7: 7955 | DOI:10.1038/s41598-017-08244-y.

Minnai et al: 'The nanocoherer: an electrically and mechanically resettable resistive switching device based on gold clusters assembled on paper', (2018) Nano Futures 2 011002, https://doi.org/10.1088/2399-1984/aab4ee.

* cited by examiner

PRIOR ART

PRIOR ART

PRIOR ART

PRIOR ART

ELECTRICAL CONTACTS FOR NANOPARTICLE NETWORKS

FIELD OF THE INVENTION

The invention relates to a lithographically fabricated electrode, particularly suited to provide an electrical contact to a nanoparticle network or film of nanoparticles.

BACKGROUND TO THE INVENTION

Current efforts to achieve neuromorphic computation are typically focused on highly organised architectures, such as integrated circuits and regular arrays of memristors, which lack the complex inter-connectivity of the brain, and so are unable to exhibit intrinsic brain-like dynamics. New architectures are therefore required, both to emulate the complexity of the brain and to achieve critical dynamics and consequent maximal computational performance.

Electrical signals from self-organised networks of nanoparticles exhibit brain-like spatiotemporal correlations and criticality when the devices are fabricated at a percolating phase transition. These self-organised 2D networks of nanoparticles provide a low-cost platform for computational approaches that rely on spatiotemporal correlations, such as reservoir computing (RC), and are a significant step towards creating neuromorphic device architectures.

PCT publication WO 2017/003303 for example discloses a neuromorphic network. Electrodes that enable electrical signals to be input and output to such a neuromorphic network are a vital component of any neuromorphic device. Known devices rely on simple fabrication processes that yield a small number of contact electrodes. However, many approaches to reservoir computing require multiple contact electrodes. Standard lithographic approaches to fabrication of such electrodes are found to have certain disadvantages. One such disadvantage is that the interface between lithographically defined electrodes and the network is found to lack robustness.

It is an object of at least preferred embodiments of the present invention to address at least some of the aforementioned disadvantages. An additional or alternative object is to at least provide the public with a useful choice.

SUMMARY OF THE INVENTION

In accordance with an aspect of the invention, a lithographically fabricated electrode comprises a continuous metal film; and a discontinuous metal film having a first edge proximal to the continuous metal film, and a second edge distal the continuous metal film.

The term 'comprising' as used in this specification means 'consisting at least in part of'. When interpreting each statement in this specification that includes the term 'comprising', features other than that or those prefaced by the term may also be present. Related terms such as 'comprise' and 'comprises' are to be interpreted in the same manner.

In an embodiment, the discontinuous metal film comprises a plurality of metallic objects, the metallic objects arranged so as to form gaps between at least some of the metallic objects.

In an embodiment, the metallic objects are arranged so as to form an absence of a pathway extending from the first edge to the second edge.

In an embodiment, at least some of the metallic objects are elongated, having respective widths in the range 1 to 50 nm.

In an embodiment, at least some of the metallic objects are fractal and/or branched.

In an embodiment, the discontinuous metal film has a surface coverage of metallic objects in the range of 0.01 to 0.65.

In an embodiment, the discontinuous metal film has a surface coverage of metallic objects in the range of 0.05 and 0.60.

In an embodiment, the discontinuous metal film comprises gold, silver and/or copper.

In an embodiment, the discontinuous metal film has a width between the first edge of the discontinuous metal film and the second edge of the discontinuous metal film in the range 0.1 to 50 microns.

In an embodiment, the continuous metal film comprises a homogeneous metallic material.

In an embodiment, the continuous metal film comprises a plurality of discrete particles that are substantially in contact with one another.

In an embodiment, the continuous metal film and/or the discontinuous metal film is/are in contact with a substrate.

In an embodiment, the substrate comprises a silicon wafer or part thereof.

In an embodiment, the substrate is coated with an insulating oxide and/or an insulating nitride.

In accordance with a further aspect of the invention, a method of fabricating an electrode comprises performing a first lithography process to form a continuous metal film; and performing a second lithography process to form a discontinuous metal film having a first edge proximal to the continuous metal film, and a second edge distal the continuous metal film.

In an embodiment, forming the discontinuous metal film comprises arranging a plurality of metallic objects so as to form gaps between at least some of the metallic objects.

In an embodiment, forming the discontinuous metal film comprises arranging the plurality of metallic objects so as to form an absence of a pathway extending from the first edge to the second edge.

The invention in one aspect comprises several steps. The relation of one or more of such steps with respect to each of the others, the apparatus embodying features of construction, and combinations of elements and arrangement of parts that are adapted to affect such steps, are all exemplified in the following detailed disclosure.

To those skilled in the art to which the invention relates, many changes in construction and widely differing embodiments and applications of the invention will suggest themselves without departing from the scope of the invention as defined in the appended claims. The disclosures and the descriptions herein are purely illustrative and are not intended to be in any sense limiting. Where specific integers are mentioned herein which have known equivalents in the art to which this invention relates, such known equivalents are deemed to be incorporated herein as if individually set forth.

In addition, where features or aspects of the invention are described in terms of Markush groups, those persons skilled in the art will appreciate that the invention is also thereby described in terms of any individual member or subgroup of members of the Markush group.

As used herein, '(s)' following a noun means the plural and/or singular forms of the noun.

As used herein, the term 'and/or' means 'and' or 'or' or both.

It is intended that reference to a range of numbers disclosed herein (for example, 1 to 10) also incorporates reference to all rational numbers within that range (for example, 1, 1.1, 2, 3, 3.9, 4, 5, 6, 6.5, 7, 8, 9, and 10) and also any range of rational numbers within that range (for example, 2 to 8, 1.5 to 5.5, and 3.1 to 4.7) and, therefore, all sub-ranges of all ranges expressly disclosed herein are hereby expressly disclosed. These are only examples of what is specifically intended and all possible combinations of numerical values between the lowest value and the highest value enumerated are to be considered to be expressly stated in this application in a similar manner.

In this specification where reference has been made to patent specifications, other external documents, or other sources of information, this is generally for the purpose of providing a context for discussing the features of the invention. Unless specifically stated otherwise, reference to such external documents or such sources of information is not to be construed as an admission that such documents or such sources of information, in any jurisdiction, are prior art or form part of the common general knowledge in the art.

In the description in this specification reference may be made to subject matter which is not within the scope of the appended claims. That subject matter should be readily identifiable by a person skilled in the art and may assist in putting into practice the invention as defined in the presently appended claims.

Although the present invention is broadly as defined above, those persons skilled in the art will appreciate that the invention is not limited thereto and that the invention also includes embodiments of which the following description gives examples.

BRIEF DESCRIPTION OF THE DRAWINGS

Preferred forms of the lithographically fabricated electrode and method of fabrication will now be described by way of example only with reference to the accompanying figures in which.

DETAILED DESCRIPTION

Figure 1:
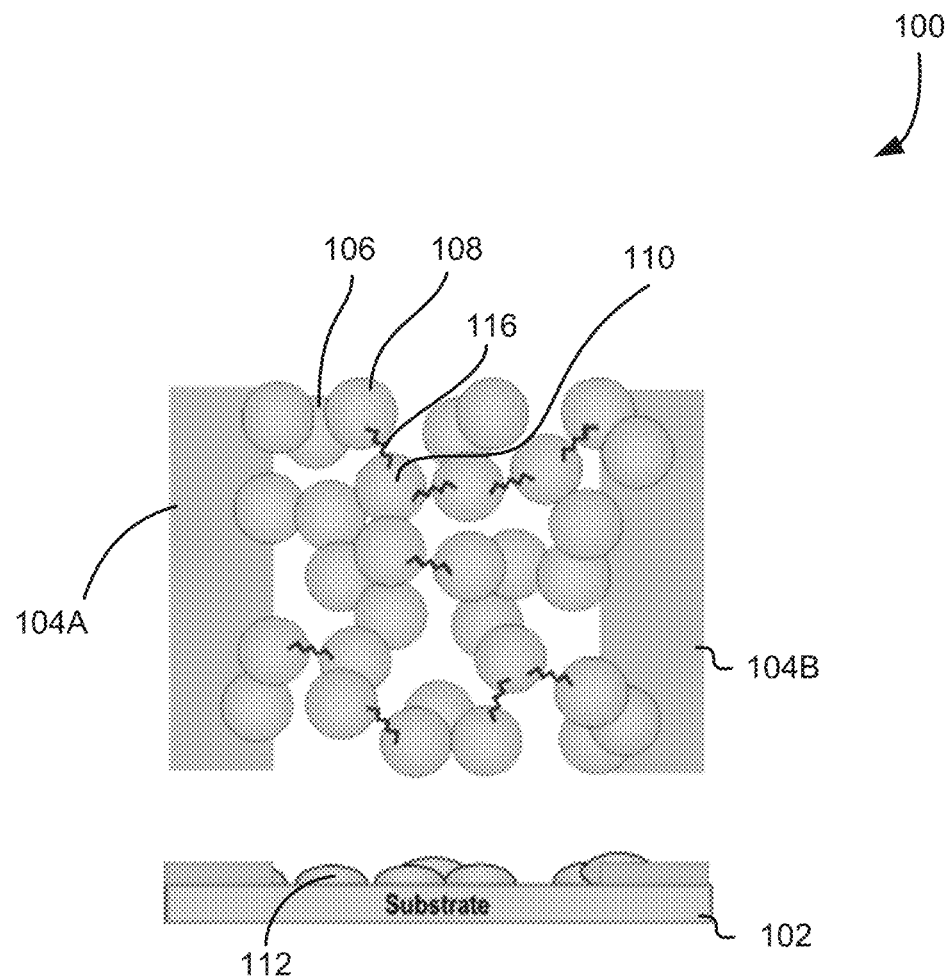
FIG. 1 shows an example of a nanoparticle network.

FIG. 1 shows a plan view and a side view respectively of a nanoparticle network 100. As shown more particularly in FIG. 1, the network includes a substrate 102. The substrate 102 is provided with at least two electrical contacts. Two such electrical contacts are shown at 104A and 104B respectively.

The electrical contacts 104 are typically defined by known shadow mask or lithographic processes, including the step of evaporation of the metal onto the substrate. Typically a sticking layer such as NiCr or Ti is first evaporated followed by an inert material such as Au.

A plurality of nanoparticles are distributed on the substrate 102. The nanoparticles are shown for example at 106, 108, 110, and 112. The nanoparticles are shown distributed on the substrate 102 between electrode 104A and electrode 104B. In an embodiment substantially all of the nanoparticles are positioned between electrodes 104A and 104B. In an embodiment at least some of the nanoparticles are positioned between electrodes 104A and 104B.

In an embodiment shown in FIG. 1 the nanoparticles are randomly distributed on the substrate 102. Nanoparticles 106 and 108 are examples of nanoparticles that are directly connected to each other and form part of a group of nanoparticles. Nanoparticles 108 and 110 are examples of nanoparticles that are not directly connected to each other because they are in different groups.

In an embodiment the network 100 includes at least one memristive element located at least partially in a gap between nanoparticles or groups of nanoparticles. FIG. 1 for example shows a memristive element 116 positioned between nanoparticle 108 and nanoparticle 110. Nanoparticles 108 and 110 are not otherwise directly connected to each other. However, the memristive element 116 is one of a plurality of memristive elements adapted to permit formation of at least one persistent pathway of increased activity in the network 100. The formation of persistent pathways is more particularly described in International PCT patent application publication WO 2017/003303.

The network 100 includes tunnel gaps between nanoparticles which act as sites for atomic scale switching processes. The tunnel gaps have some features in common with biological synapses and neurons, and with the weighted connections between nodes in an artificial neural network and in a preferred embodiment exhibit memristive behaviour.

Figure 2:
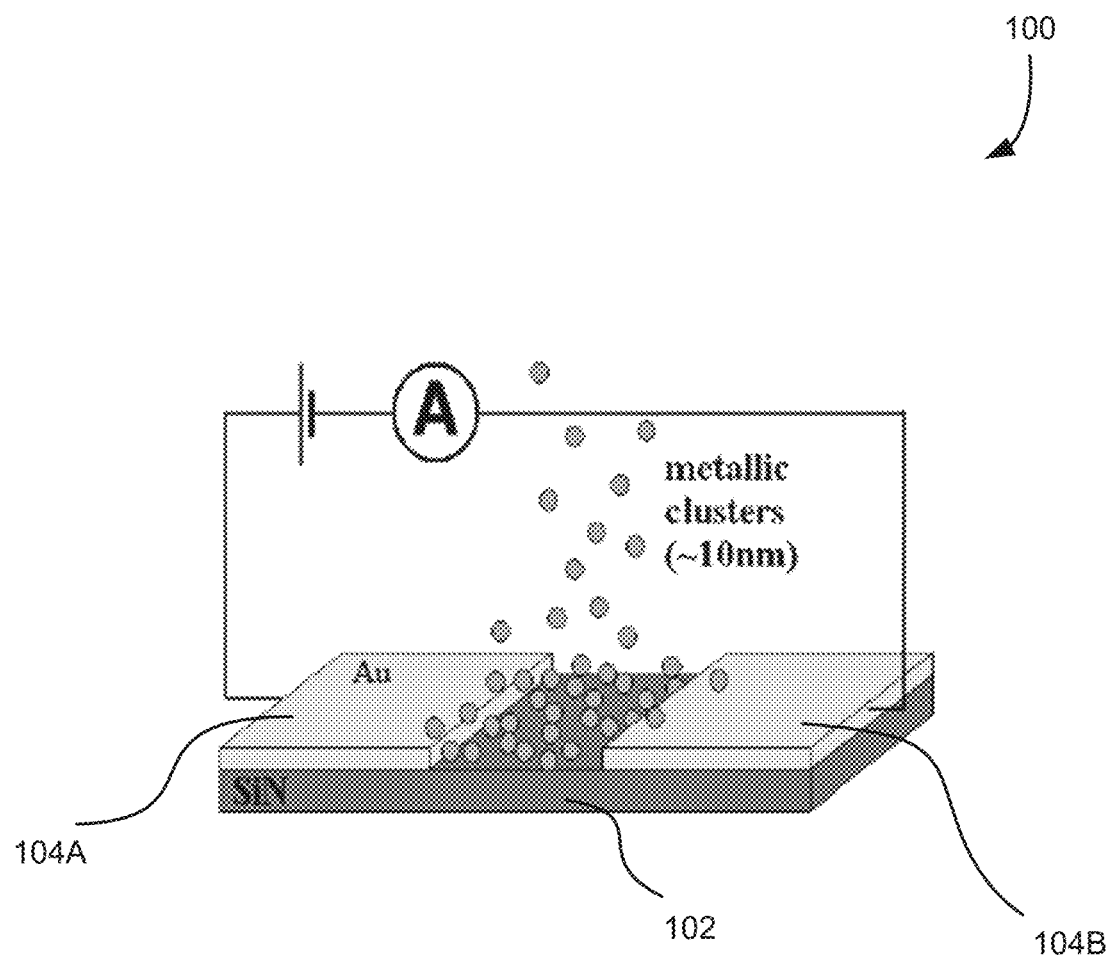
FIG. 2 shows an example of a deposition process for forming the network shown in FIG. 1.

FIG. 2 shows an example of a deposition process for forming the network 100. More particularly, FIG. 2 shows the deposition of clusters of nanoparticles to form a device. The device comprises the substrate 102 and lithographically defined contacts or electrodes 104A and 104B.

Figure 3:
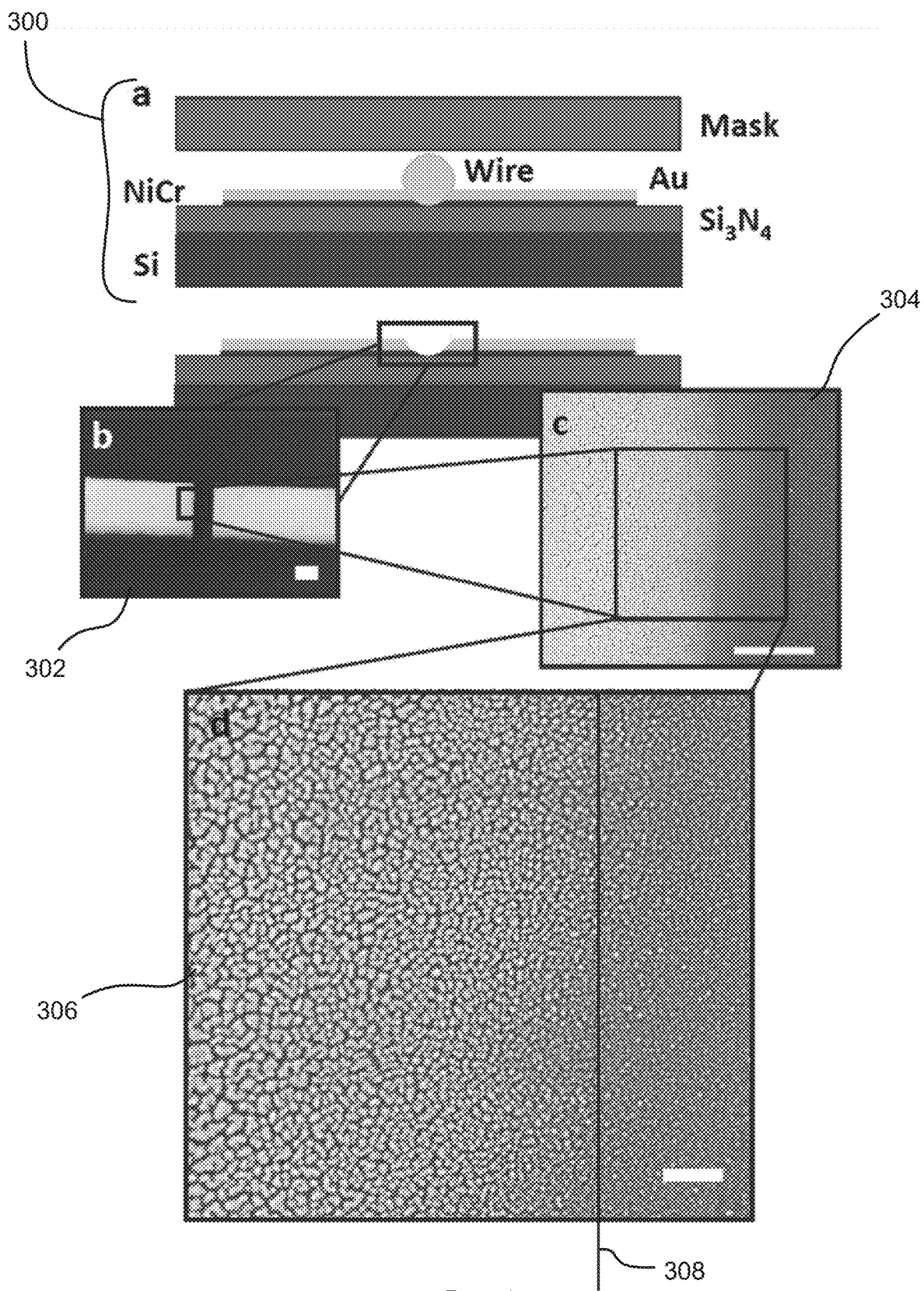
FIG. 3 shows an example of an electrode fabricated using a known shadow mask process.

FIG. 3 shows a known process for fabricating electrodes 104A and 104B. The electrodes are fabricated by evaporating metals onto substrates through a metallic shadow mask. The procedure is a type of stenciling.

In an embodiment, in order to obtain a relatively small gap (100 µm) between the two electrodes, a thin metallic wire is placed between the mask and the substrate.

Shown at 300 is a schematic of the shadow mask process. Importantly, smooth edges are directly created during NiCr—Au deposition due to the spacing between the thin wire and the substrate. Shown at 302 is an SEM image of a two-electrode device (scale bar: 100 µm). Shown at 304 is an SEM image of an electrode edge of the same device.

Discontinuities in the Au layer are apparent (scale bar: 1 µm). Shown at 306 is zoomed image of the electrode edge 308. The discontinuities are more widespread (scale bars: 100 nm).

In an embodiment, a slightly modified technique is used to successfully fabricate four-electrode devices. However, shadow mask techniques cannot conveniently be used to fabricate large numbers of contacts. Such shadow mask techniques are limited to devices with relatively large dimensions.

Lithographic techniques are required to produce devices with large numbers of small-scale electrodes, and which are integrated with other structures, including electronic devices. The advantages of standard lithographic techniques in terms of manufacturability are offset by a lack of robustness due to the absence of a discontinuous layer.

FIGS. 4 to 7 show variations of lithographic techniques for manufacturing electrodes. Electrodes that are made with photolithographic techniques in order to provide contact to the nanoparticle networks need to satisfy several criteria, specifically in regard to the electrode edges.

Figure 4:
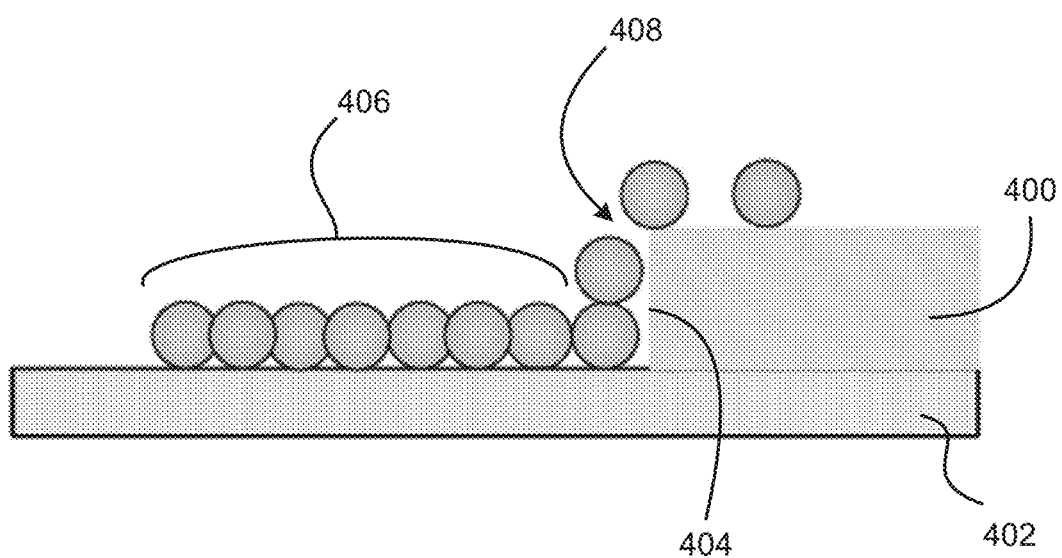
FIGS. 4 to 7 show variations of the structure of the electrode edges and their effect on the effectiveness as a contact to a nanoparticle film.

FIG. 4 shows a known electrode formed from a continuous metal film 400 mounted on a substrate 402. The film has an edge 404 that is perpendicular to the substrate 402 and/or parallel to a direction of travel of the nanoparticles 406 during deposition.

In an embodiment the continuous metal film 400 comprises a solid/homogeneous metallic material. In an embodiment the film 400 comprises a plurality of discrete film particles that are substantially in contact with one another. In an embodiment the film 400 comprises metallic material arranged so as to form at least one pathway across the continuous metal film. The pathway(s) is/are formed laterally in a plane parallel to the plane of the substrate 402.

The interface between the electrode and the network of nanoparticles is potentially a weak link of the system. As shown in FIG. 4, a gap 408 can open between the electrode and the network causing device failures. The gap 408 can be formed during deposition, due to the geometry of the electrode edge.

Figure 5:
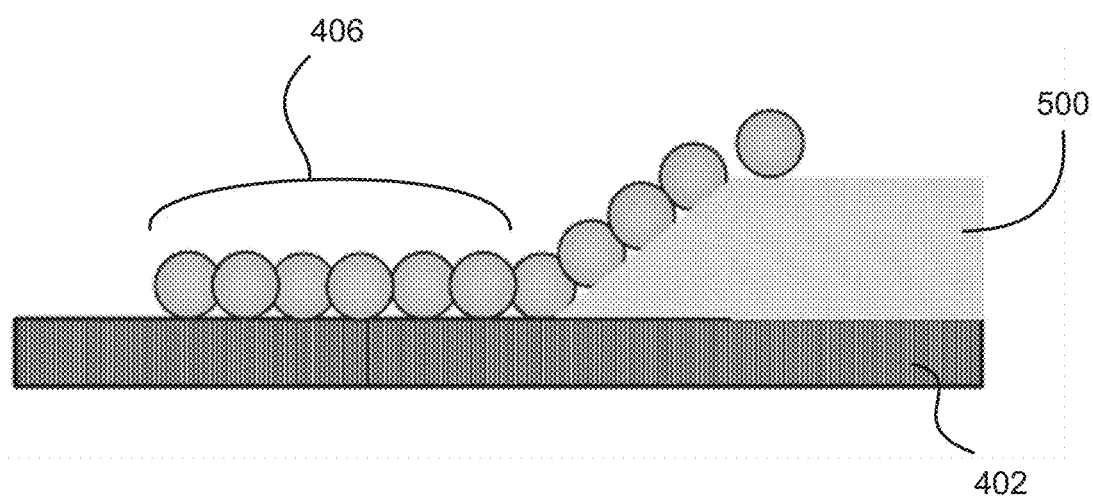

FIG. 5 shows one example of a known solution to the problem of a gap forming during deposition. A continuous metal film 500 is mounted on the substrate. The film is made of the same material as film 400. The film 500 is shaped so as to form an edge that is sloped with respect to the substrate 402 and/or the direction of travel of the deposited nanoparticles 406.

Figure 6:
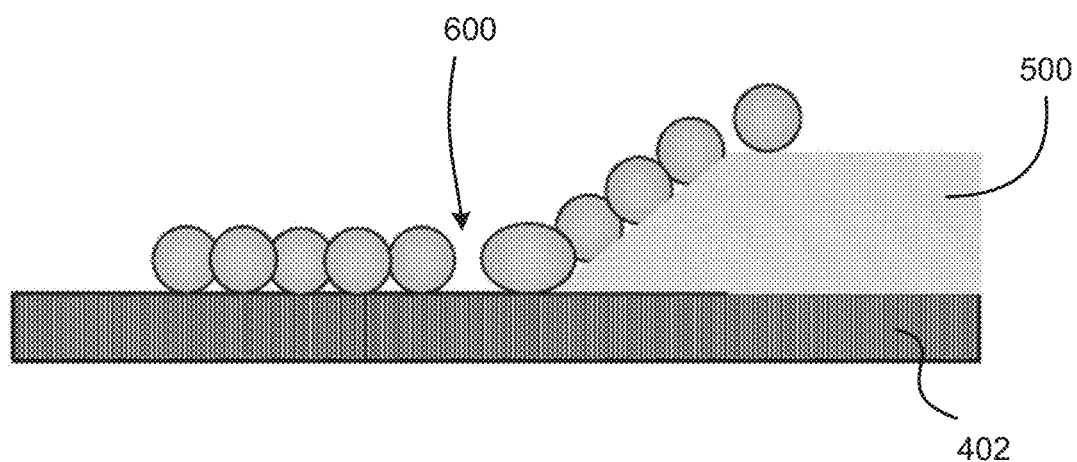

FIG. 6 shows the known continuous metal film 500 of FIG. 5 that is sloped with respect to the substrate 402. During electrical testing, narrow connections between the network and the electrodes can be broken by high currents or by coalescence effects. This has the potential to cause a gap 600. To be effective, the electrodes must provide robust connections to the network and specifically the electrode edges must facilitate robust connections.

Figure 7:
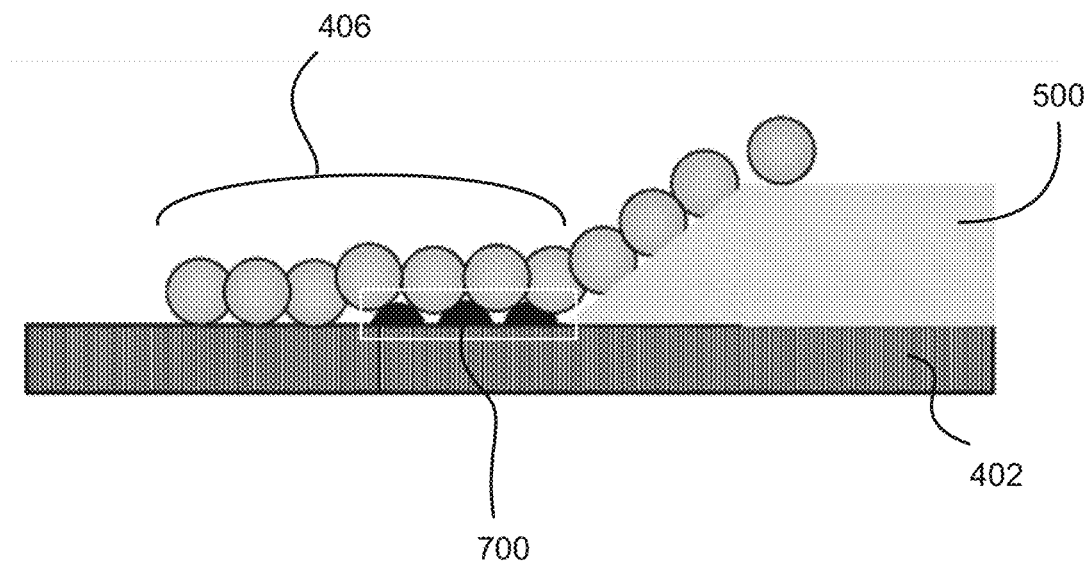

FIG. 7 shows an example of a solution to the problem of a gap forming during nanoparticle deposition and/or exposure to high currents. The electrode shown in FIG. 7 includes the continuous metal film 500 and a discontinuous metal film 700 proximal to the continuous metal film 500.

The continuous metal film 500 shown in FIG. 7 represents an embodiment in which continuous metal film 500 is sloped with respect to the substrate 402.

In an embodiment, the discontinuous metal film 700 comprises a plurality of discrete film particles. These discrete film particles are shown in FIG. 7 as having gaps between them. In an embodiment at least some of the film particles in the film 700 are spaced apart from each other so as to form gaps between at least some of the film particles.

In an embodiment, the film particles are formed by atomic deposition onto the substrate and subsequent coalescence of the atoms. In an alternate embodiment the film particles are deposited substantially in their final form. In an embodiment the resultant film particle size and/or structure and/or surface coverage is controlled by parameters such as the deposition rate and ambient/vacuum conditions during the deposition of film particles or atoms.

In an embodiment the film particles are deposited so as to form an absence of a pathway of connected film particles across the width of the discontinuous film. In an embodiment at least some of the discrete film particles are connected to each other. In some arrangements of film particles there will be partial pathways across the discontinuous film. These partial pathways are formed laterally in the plane of the substrate 402.

While there may be pathways that extend partially across the width of the discontinuous film, the discontinuous film is not homogeneous and in a preferred embodiment there is an absence of a complete pathway across the width of the discontinuous film from one edge of the discontinuous film to another.

In an embodiment the discontinuous metallic film comprises gold, silver and/or copper.

FIG. 7 shows the continuous metal film 500 and the discontinuous metal film 700 both in contact with the substrate 402.

Described below is a process for fabricating photolithographic two-electrode devices that behave similarly to known shadow mask counterparts. A desirable outcome is to avoid significantly altering the surface of the substrate during the fabrication process. Major alterations to the substrate surface have the potential to lead to changes to the coalescence of the deposited nanoparticles and thus to changes to the final structure and morphology of the nanoparticle network.

Figure 8:
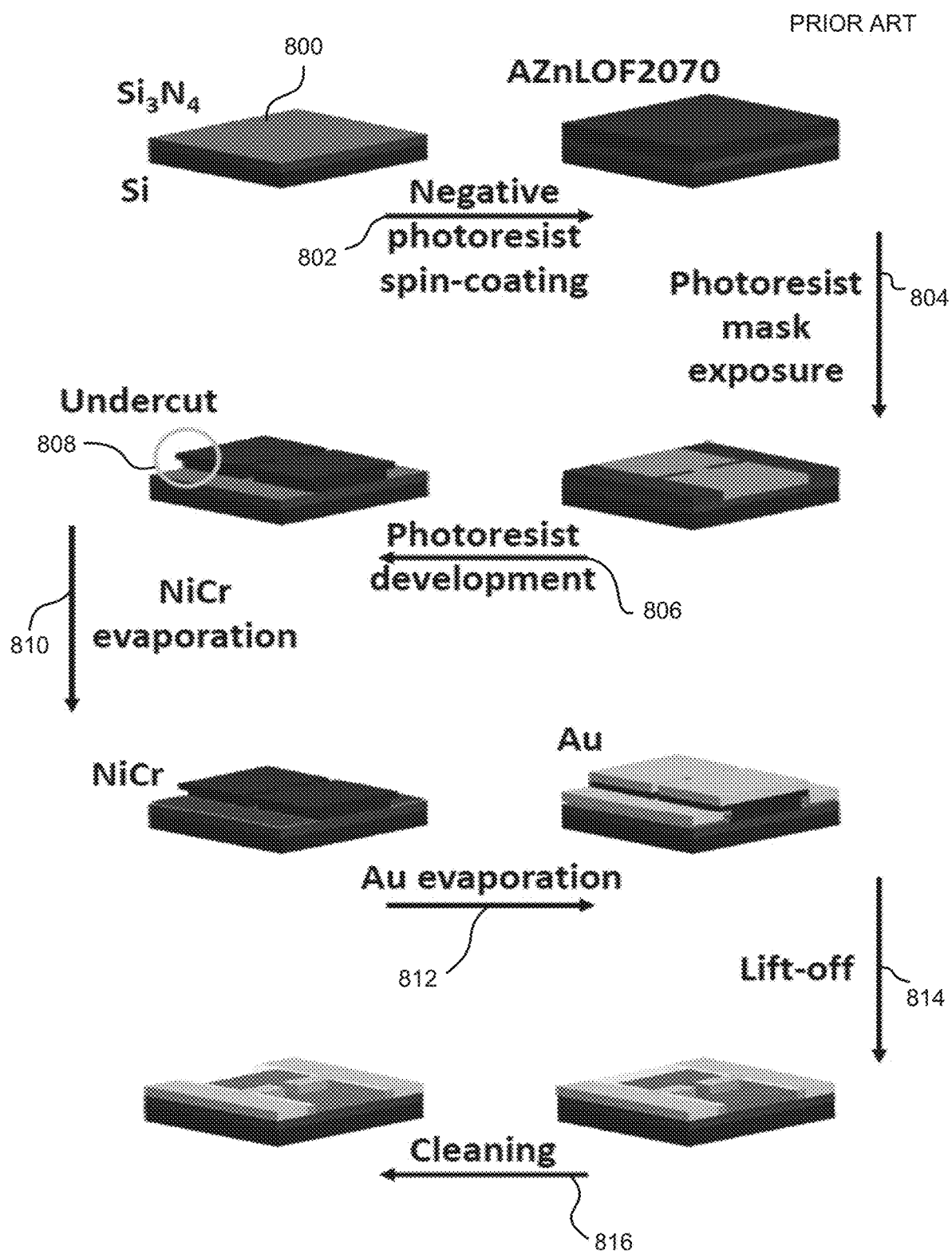
FIG. 8 shows a known lithographic process for contact fabrication to achieve smooth electrode edges.

FIG. 8 shows a known lithographic process for contact fabrication, which is specifically designed to produce an undercut in the photoresist profile and hence to achieve smooth electrode edges. The process begins with a silicon wafer 800 coated with an insulating material such as $Si_3N_4$ or $SiO_2$. The process includes the following steps:

Step i: the wafer is cleaned with acetone and then with isopropyl alcohol. The wafer is subsequently dried with $N_2$ and undergoes an $O_2$ plasma ashing step for 5 minutes at 100 W, with a flow rate of ~5 sccm and chamber pressure of ~100 mTorr. The wafer is then baked on a hot plate for 5 minutes at 120 degrees C. in order to remove potential residues from the organic solvents.

Step ii: negative photoresist AZnLOF2070 is spin-coated 802 on the wafer at 4000 rpm for 60 seconds (ramp speed 4000 rpm/s) and then baked on a hot plate for 90 seconds at 110 C to stabilise the photoresist.

Step iii: the wafer is exposed 804 through a mask with UV light at an energy of around 80 mJ/cm$^2$ and then baked on a hot plate for 90 seconds at 110 degrees C. The post-exposure baking step is fundamental for the cross-linking process of the exposed areas.

Step iv: the wafer is developed 806 in a metal-ion free (MIF) solution, AZ 326 MIF, for 60 seconds in order to remove the unexposed areas. This step is repeated twice in order to achieve the desired undercut 808.

Step v: 5 nm of NiCr are deposited 810 on the wafer with a thermal evaporator, Edwards Auto 306, at a rate of 1 nm/min.

Step vi: 45 nm of Au are deposited 812 on the wafer with the thermal evaporator, at a rate of 3 nm/min.

Step vii: the wafer undergoes a lift-off 814 process in Remover PG which is a proprietary solvent stripper at 120 degrees C. in order to remove the unexposed areas. During this process the wafer is suspended face down in a large glass container and left submerged until the whole material gently peels off as a whole to avoid defects and redeposition of material. This process usually lasts for 2 hours.

Step viii: the wafer is cleaned 816 by rinsing with acetone and isopropyl alcohol, dried with $N_2$ and treated with an $O_2$ plasma ashing step for 5 minutes at 100 W, with a flow rate of ~5 sccm and chamber pressure of ~100 mTorr in order to remove any potential residue.

Figure 9:
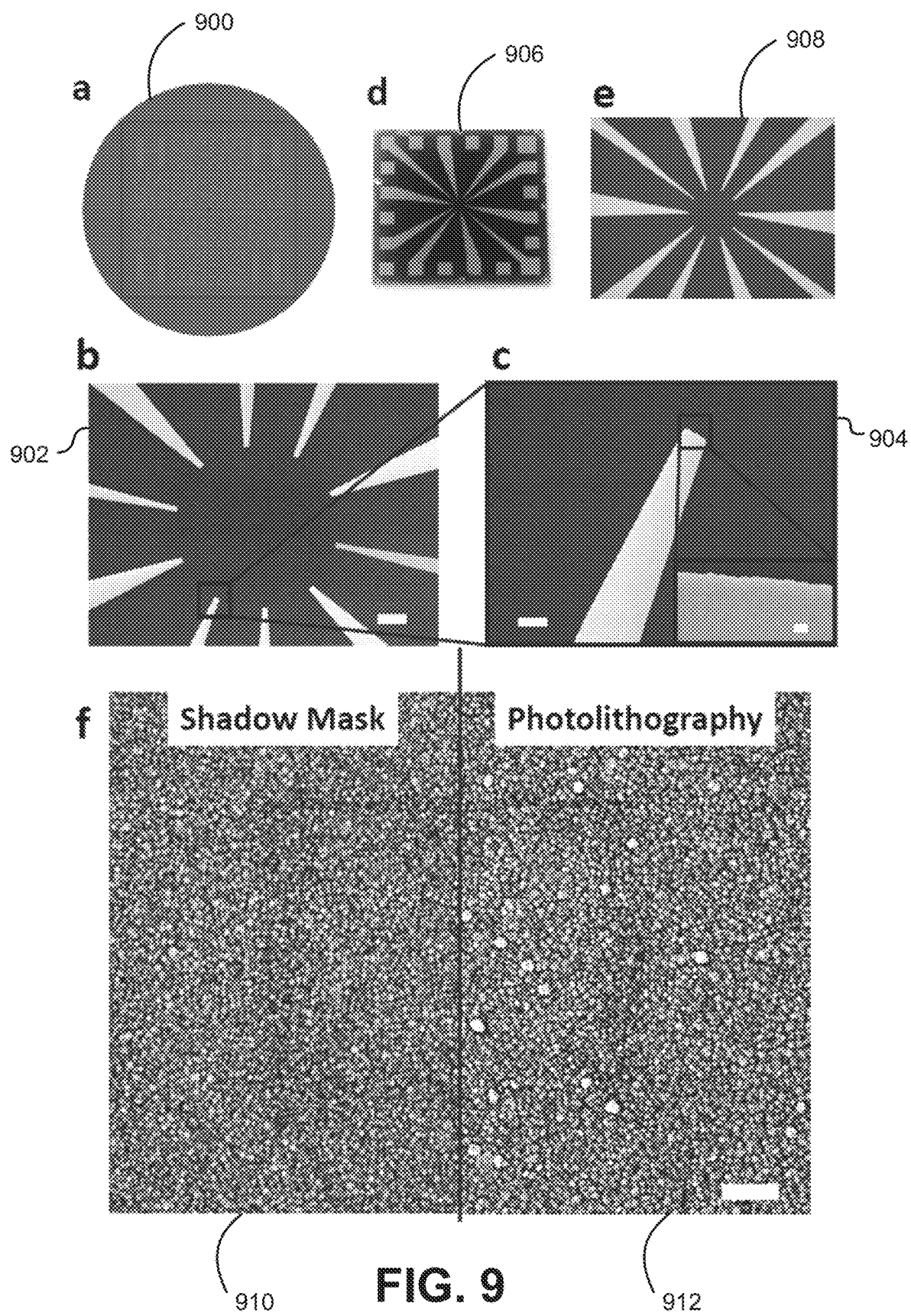
FIG. 9 shows an example of a mask used for a photolithography process, fabricated electrodes, and a comparison of Au grain sizes within a continuous metal film.

FIG. 9 shows an example 900 of a mask used for the photolithography process, and optical and electron microscope images of fabricated electrodes 902, 904, 906 and 908. Also shown is a comparison of Au grain sizes on the surface of the centres of a shadow mask electrode 910 (similar to the electrodes shown in FIG. 3) and of a photolithographic electrode 912 demonstrating that the grains are substantially in contact with each other and thereby confirming that both electrodes have substantially continuous parts.

After fabrication, the wafers are spin-coated with AZ1518 and baked on a hot plate at 90 degrees C. for 60 seconds in order to create a protective layer of photoresist which is required for the subsequent dicing process. The wafer is then cut into 11×11 mm devices with a dicing saw so as to provide single devices with a size matching that required for insertion into the deposition system. A subsequent cleaning step is performed on the devices in order to remove the protective photoresist layer in preparation for the deposition of Sn nanoparticles.

Figure 10:
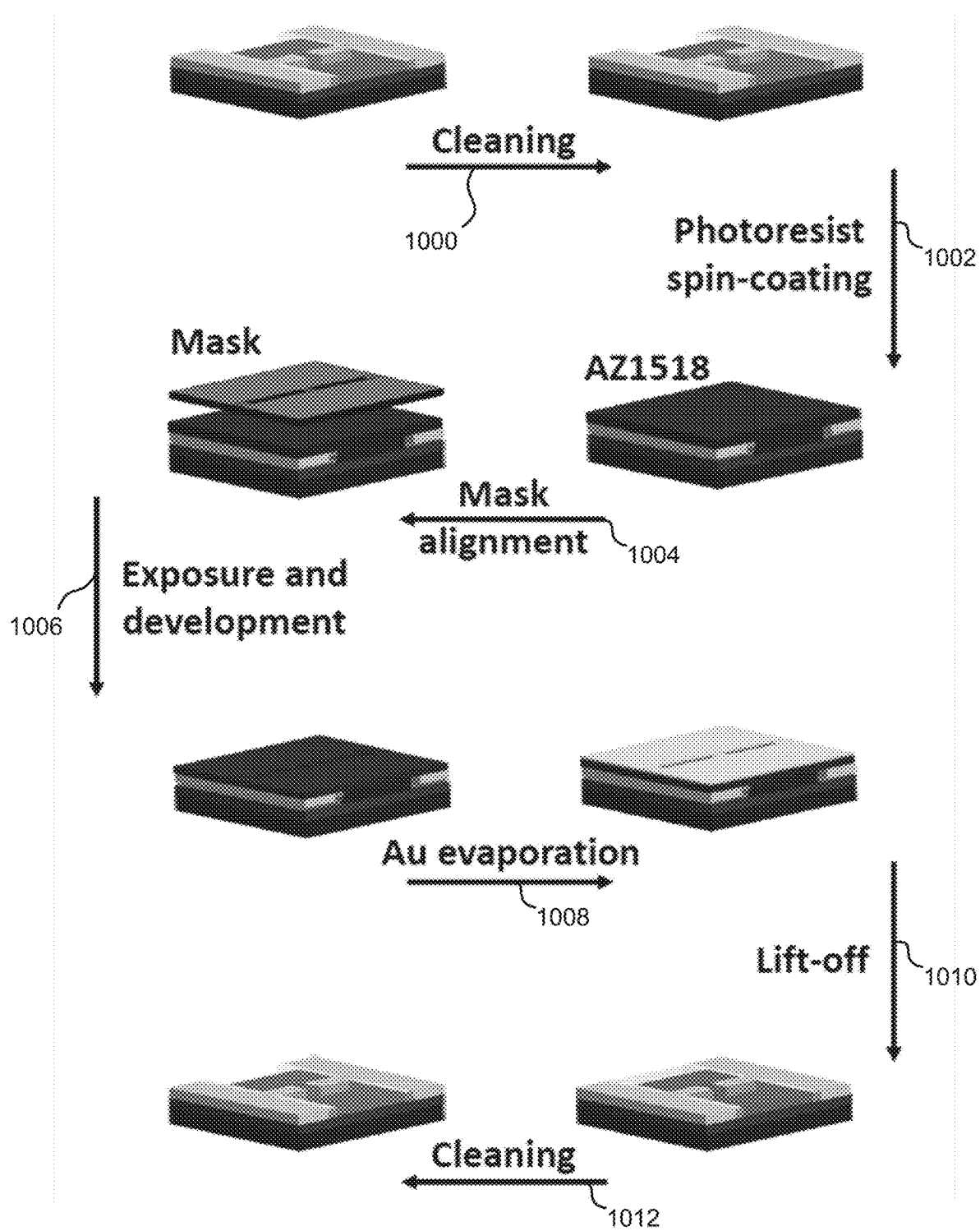
FIG. 10 shows a schematic of a lithographic process for contact fabrication to achieve a discontinuous metal film proximal to a continuous metal film.

FIG. 10 shows a schematic of an improved lithographic process for contact fabrication. The process of FIG. 10 introduces a discontinuous Au layer in a band close to electrode edges, the electrode comprising a continuous film formed by a lithographic process similar to that shown in FIG. 8. The discontinuous Au layer allows the network to assemble between the electrodes in the same way as in shadow mask devices. The network is connected more strongly to the edges of the improved electrodes than to standard lithographically defined electrodes due to the band made of discontinuous Au.

To obtain the desired pattern, additional photolithographic steps are required in addition to those shown in FIG. 8. The additional lithography process includes the following steps:

Step i: the devices (which have pre-formed electrodes comprising a continuous film formed by a lithographic process similar to that shown in FIG. 8) are cleaned 1000 with acetone, isopropyl alcohol and dried with N2. An ashing treatment with $O_2$ plasma is performed for five minutes at 100 W and with a flow rate of ~5 sccm and chamber pressure of ~100 mTorr. The devices are then baked at 120 degrees C. for 5 minutes in order to remove potential residues from the organic solvents.

Step ii: positive photoresist AZ1518 is spin-coated 1002 on the devices at 3000 rpm for 60 seconds (ramp speed 3000 rpm/s) and then baked on a hot plate for 2 minutes at 100 degrees C. in order to stabilise the photoresist.

Step iii: the device is precisely aligned 1004 with a mask.

Step iv: the device is then exposed 1006 through the mask with UV light for 15 seconds in hard mode and then developed in a metal-ion free (MIF) solution, AZ 326 MIF for 30 seconds in order to remove the exposed areas.

Step v: 1.5 nm of Au are deposited 1008 with the thermal evaporator at a rate of 0.3 nm/min.

Step vi: the device undergoes a face down lift-off 1010 process in dimethyl sulfoxide (DMSO) at 80 degrees C. for 5 minutes in order to remove the undesired material.

Step vii: the device is cleaned 1012 by rinsing with acetone and isopropyl alcohol, dried with $N_2$ and treated with an $O_2$ plasma ashing step at 100 W for 5 minutes in order to remove any potential residue.

Figure 11:
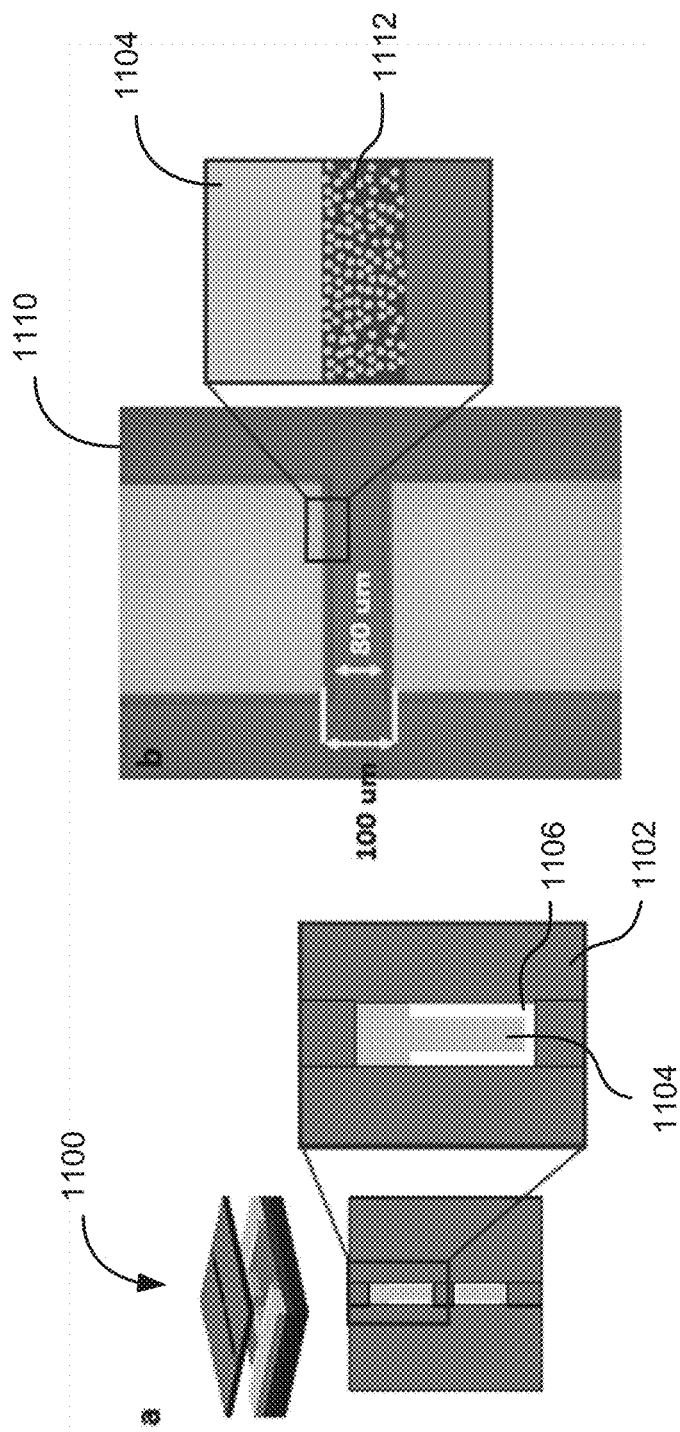
FIG. 11 shows alignment of a discontinuous film proximal to a continuous metal film.

FIG. 11 shows detail of the additional lithographic process required for alignment of the discontinuous film with the main metallic electrode. The process of alignment of the device with a mask from FIG. 10 is shown at 1100. The central elements of the figure show that an opening in the photoresist layer 1102 is aligned with a continuous film 1104 such that part of a substrate 1106 proximal to the continuous film 1104 is available uncovered in preparation for deposition of a discontinuous film.

Optical microscope images of the results after evaporation and before lift-off are shown at 1110. The opening in the photoresist layer, where the discontinuous film 1112 is to be deposited, is visible in the image as a shadow proximal to the continuous film 1104. In an embodiment, the lift-off step includes optimisation. The right-most image in FIG. 11 shows a schematic of the discontinuous film 1112, which is proximal to the continuous film, after lift-off.

Figure 12:
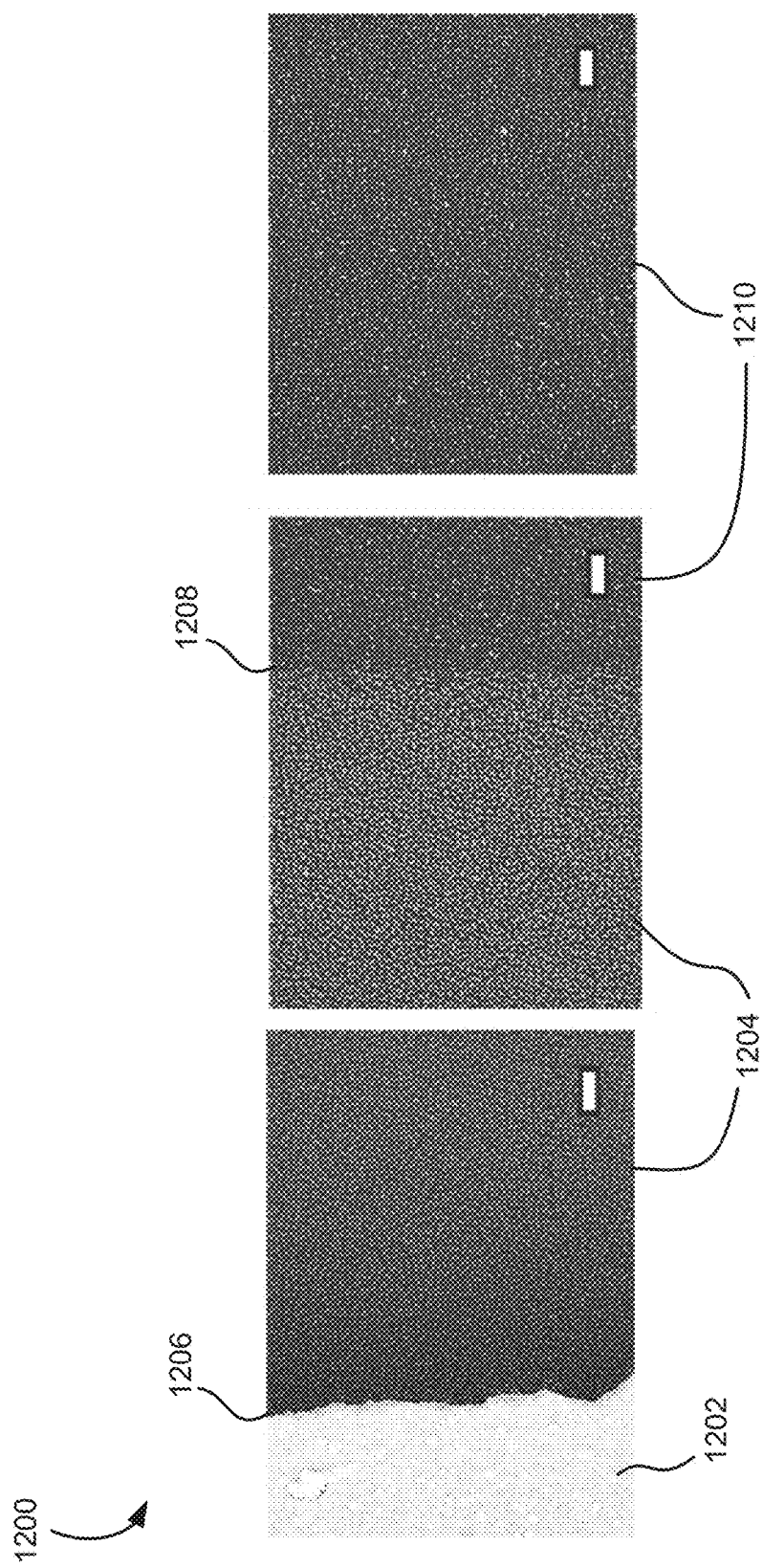
FIGS. 12 and 13 show a comparison of the discontinuous films produced by different deposition processes.

FIG. 12 shows an example 1200 of a discontinuous film after carrying out a lift-off process using acetone. The continuous metal film is shown at 1202. The discontinuous metal film is shown at 1204, having first edge 1206 and second edge 1208.

Shown at 1210 is a surface, for example of a substrate. A small amount of the metallic objects forming the discontinuous metal firm can be redeposited on surface 1210 due to the high volatility of acetone. In this example the metallic objects comprise gold (Au) and a small amount of these objects can be observed on surface 1210.

Figure 13:
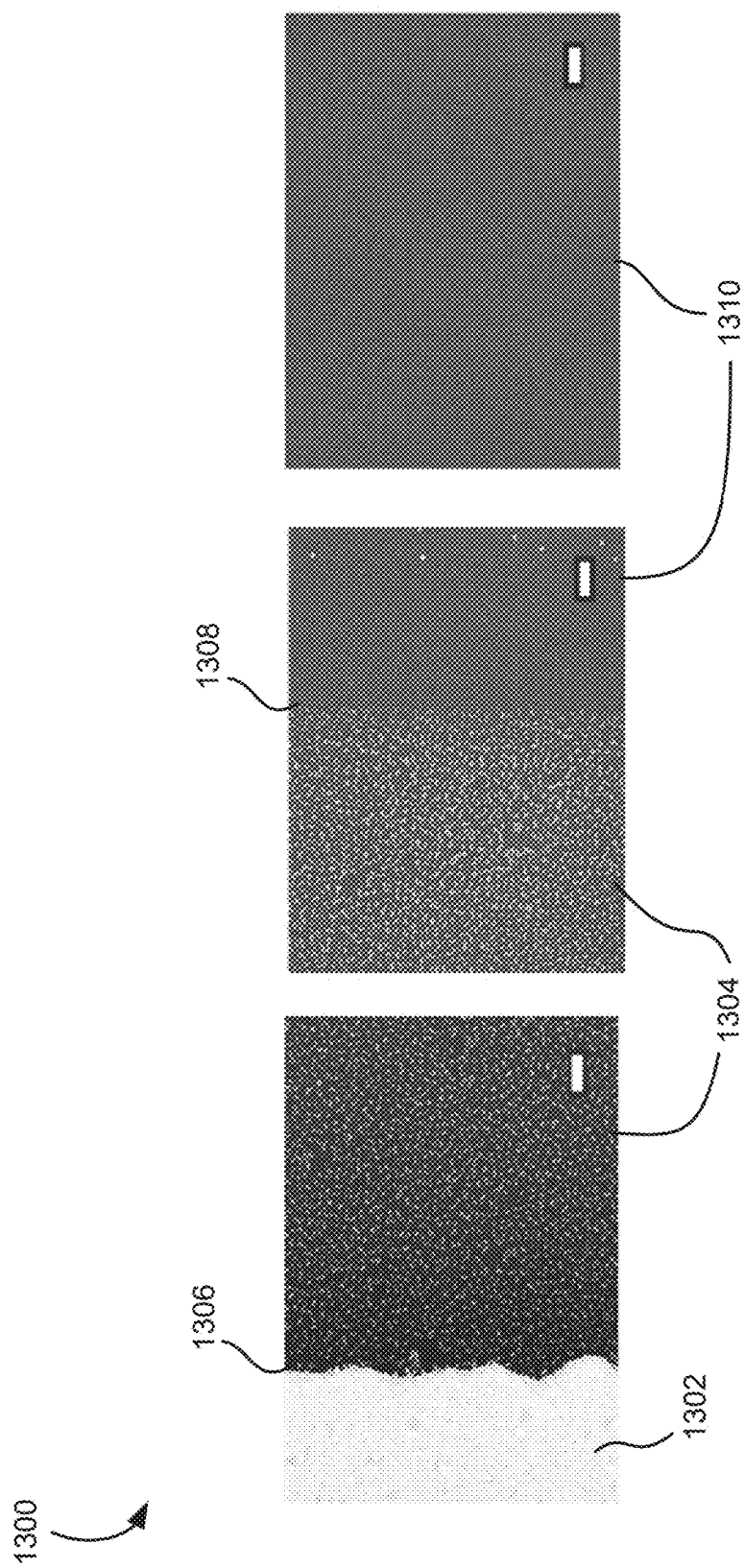

FIG. 13 shows an example 1300 of a discontinuous film after carrying out a lift-off process using DMSO. The continuous metal film is shown at 1302. The discontinuous metal film is shown at 1304, having first edge 1306 and second edge 1308.

Shown at 1310 is a surface, for example of a substrate. Acetone from FIG. 12 has been replaced with DMSO to avoid the redeposition of Au between the electrodes during lift-off. No Au residue can be observed on surface 1310.

Figure 14:
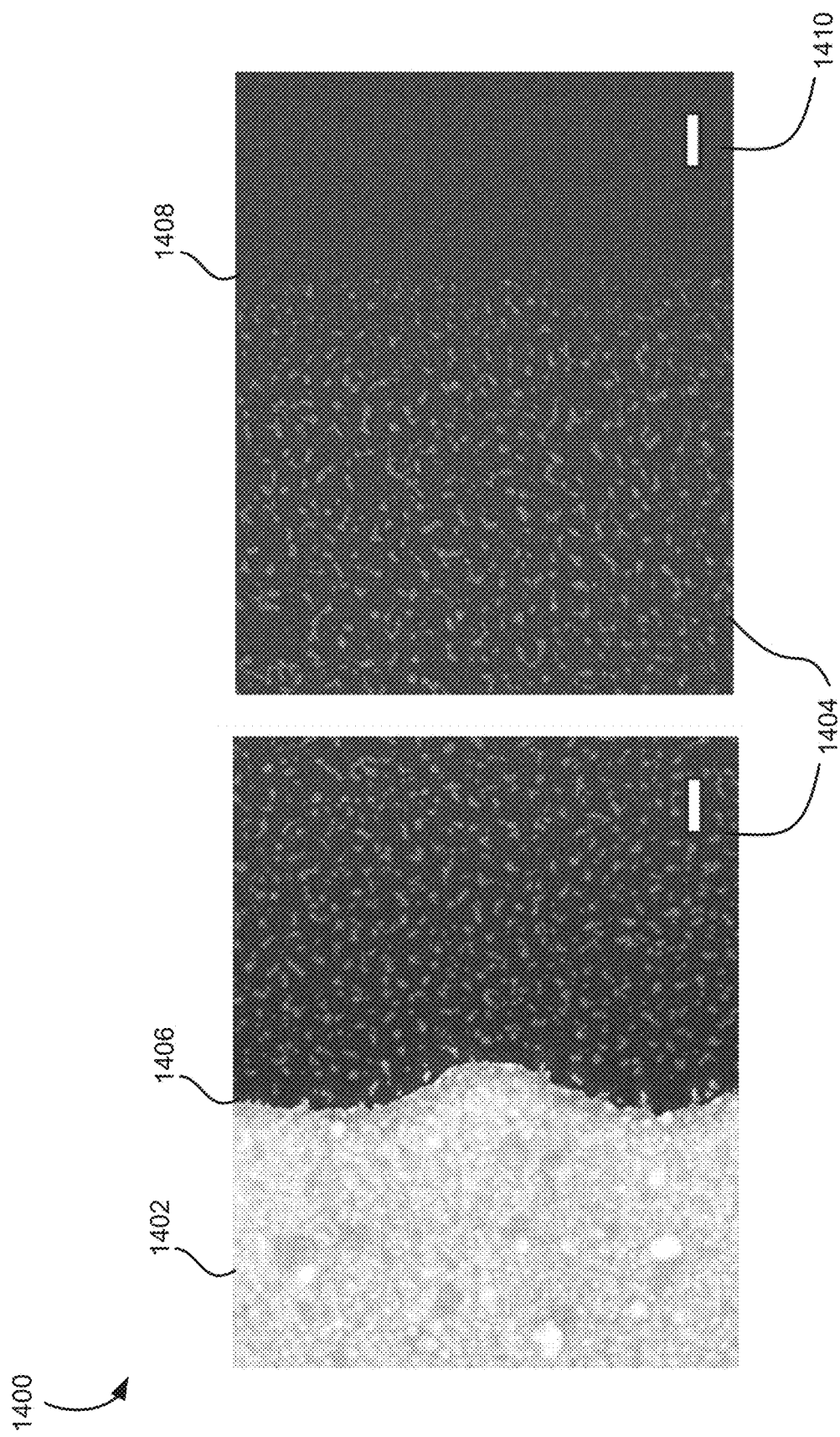
FIG. 14 shows magnified views of a discontinuous film produced by the optimised deposition process.

FIG. 14 shows a magnified view of a device from FIG. 13 prepared using DMSO. The electrode 1400 includes a continuous metal film 1402 and a discontinuous metal film 1404. Discontinuous metal film 1404 includes a first edge 1406 and a second edge 1408.

In an embodiment first edge 1406 is proximal to continuous metal film 1402. As shown in FIG. 14 the continuous metal film 1402 may be positioned adjacent first edge 1406 of discontinuous metal film 1404.

Second edge 1408 is positioned distal continuous metal film 1402. Second edge 1408 represents a boundary between discontinuous metal film 1404 and an area on, for example a substrate 1410 on which there is no deposition of either continuous metal film 1402 nor discontinuous metal film 1404.

As shown in FIG. 14, discontinuous metal film may comprise a plurality of metallic objects. The metallic objects may be arranged so as to form gaps between at least some of the metallic objects.

The metallic objects may be shaped in different ways. For example, some metallic objects may be branched. Some metallic objects may be fractal. Other metallic objects may be oval or at least partly circular.

Those metallic objects that may be elongated may have a width in the range 1 to 50 nm.

Figure 15:
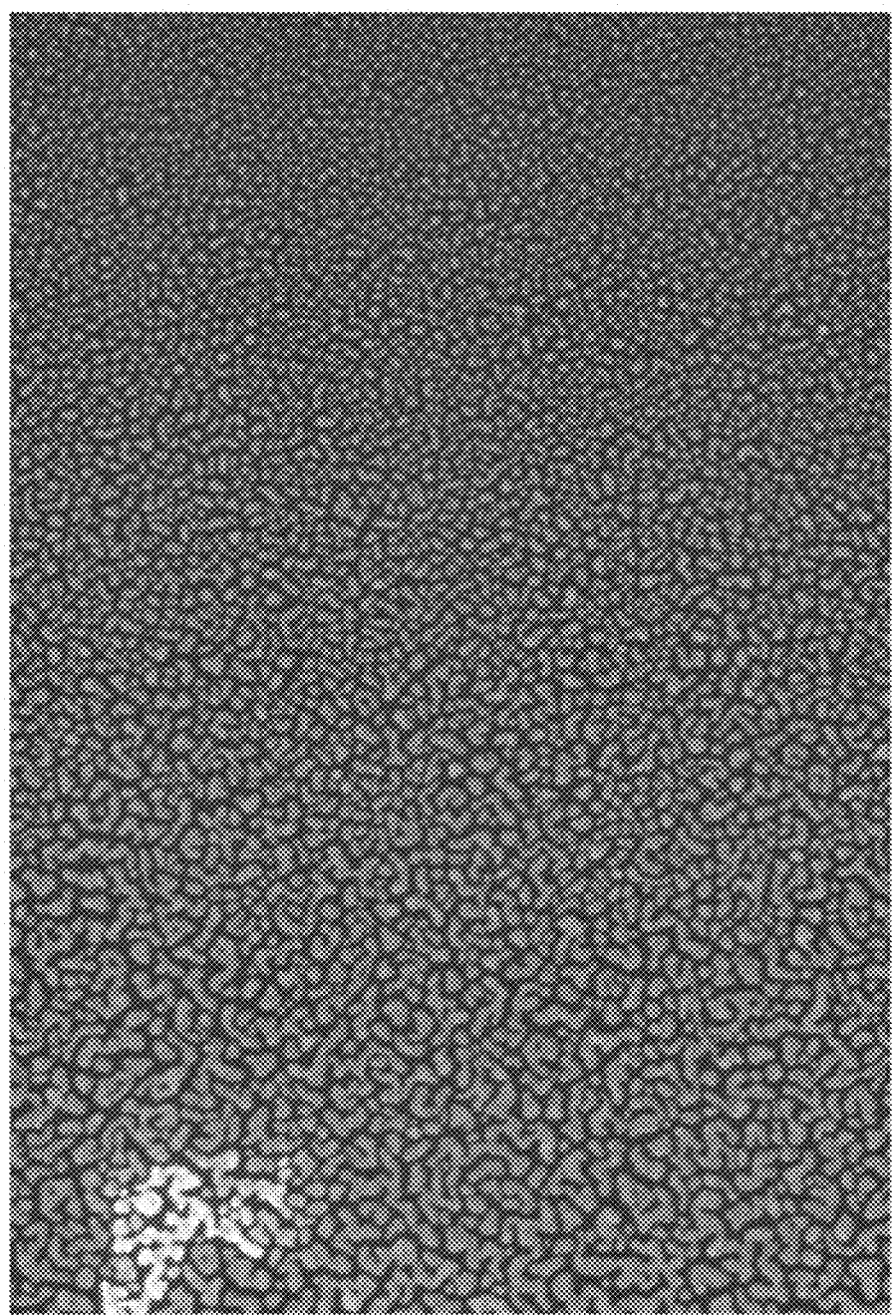
FIGS. 15 and 16 show an example of a discontinuous metal film showing various shapes of metallic objects.

FIG. 15 shows an example of a discontinuous metal film showing various shapes of metallic objects.

Figure 16:
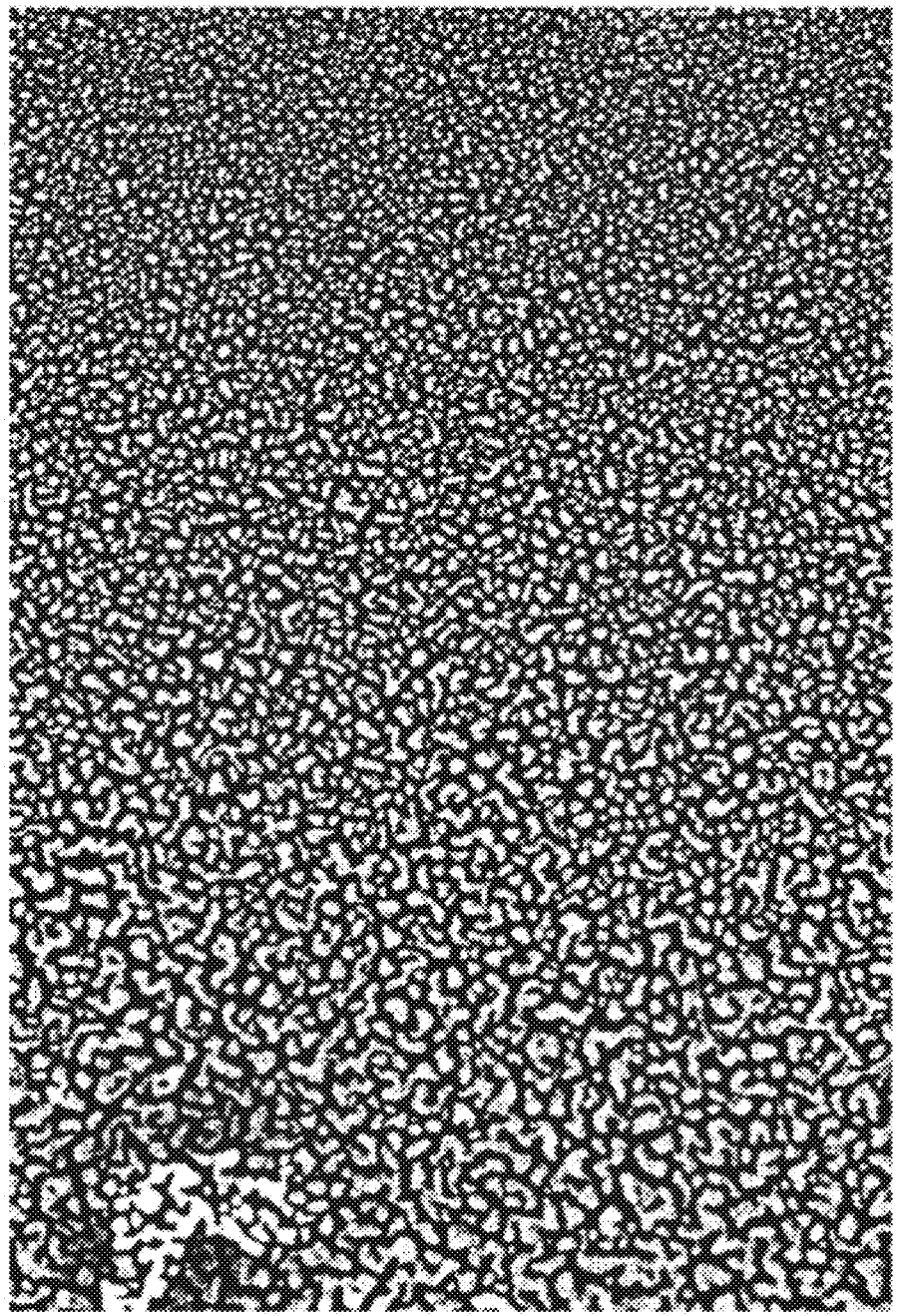

FIG. 16 shows the discontinuous metal film of FIG. 15 that is presented in black and white rather than greyscale. The metallic objects, in this case gold particles, are shown in white. The substrate on which the metallic objects are deposited are shown in black.

It can be observed in FIG. 16 that different shaped structures include isolated spheres and elongate strings.

Figure 17:
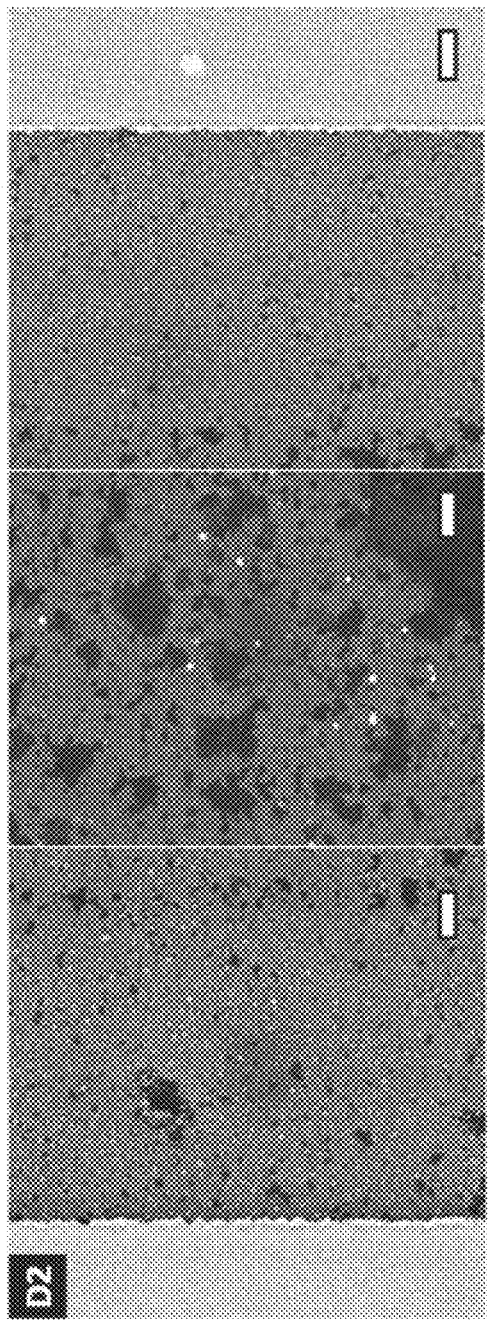
FIGS. 17 and 18 show examples of SEM images.

FIG. 17 shows an example of SEM images showing discontinuous bands, morphology, and electrode edges of a device fabricated with the optimised method.

Figure 18:
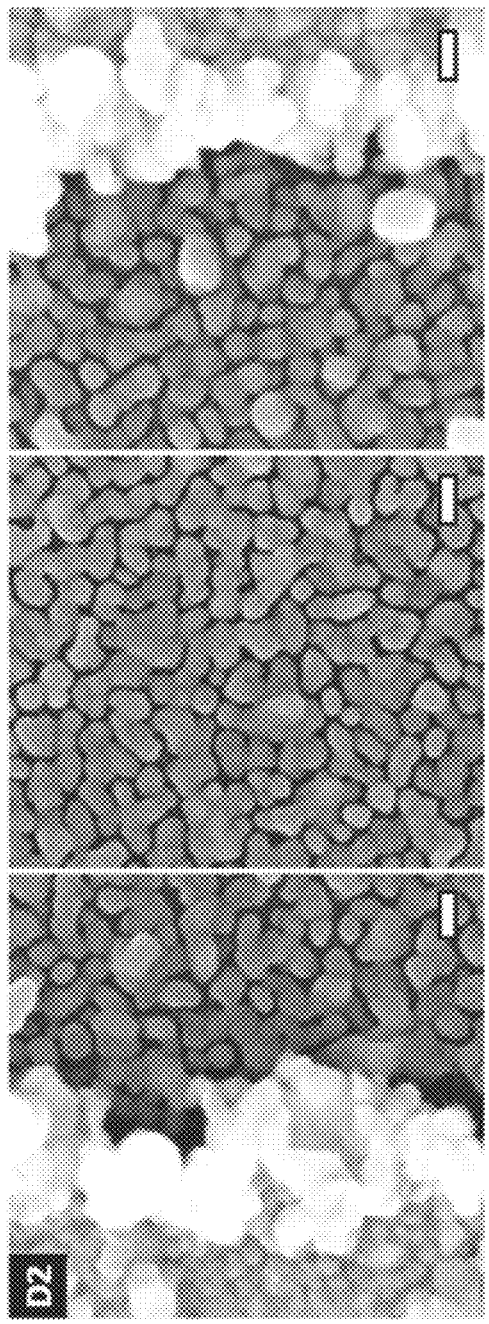

FIG. 18 shows additional examples of further magnified SEM images showing discontinuous bands, morphology, and electrode edges of a device fabricated with the optimised method.

Figure 19:
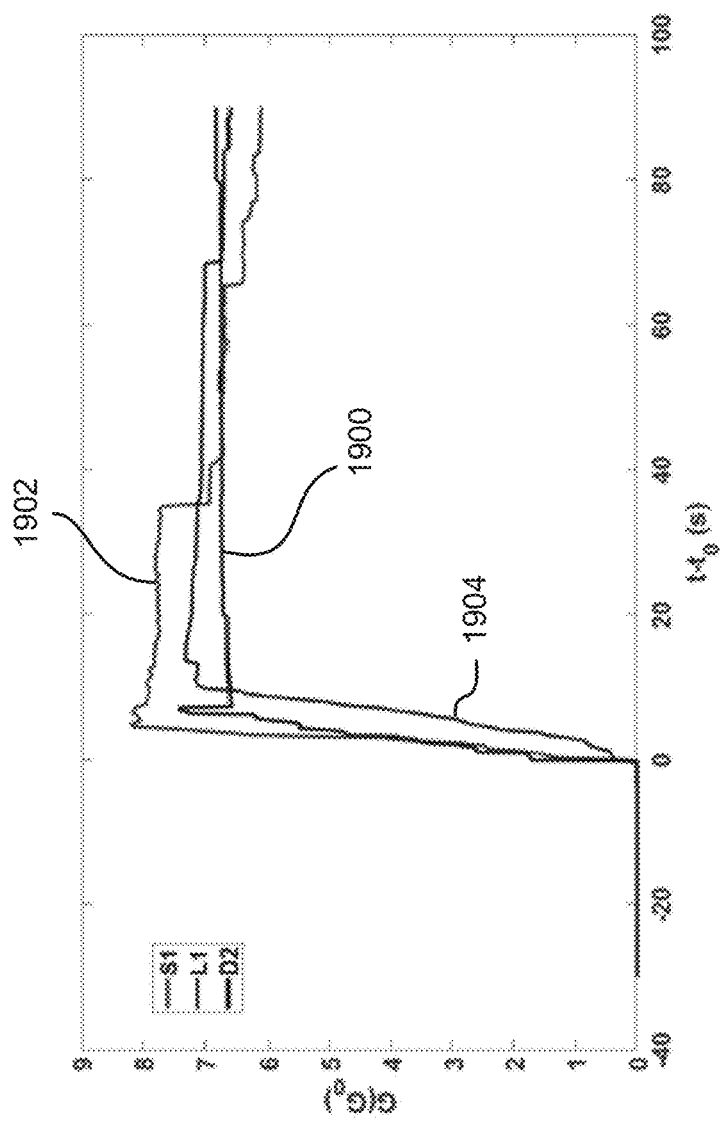
FIG. 19 shows the onset of conduction during deposition of Sn nanoparticles.

FIG. 19 shows the onset of conduction during deposition of Sn nanoparticles. The onset for a discontinuous film device 1900 is similar to the ones of standard shadow mask device 1902 and original photolithographic device 1904, with sharp and sudden initial increase in conductance.

A conductance of $2G_0$ ($G_0=7.7\times10^{-5}\Omega^{-1}$ is the quantum of conductance) is reached within the first 10 seconds from the onset of conduction for all the different devices. Moreover, the desired target conductance, $6G_0$, is reached within 20 seconds from the onset of conduction for all the different devices. This suggests that the optimised lift-off process is successful. The fact that the length of the onset is comparable to that of the simple devices suggests strongly that the coalescence of the deposited Sn nanoparticles proceeds normally in the space between the electrodes which in turn confirms the absence of residual Au or PR.

Electrical responses to standard stimuli showed that the discontinuous film device 1900 behaves similarly to the shadow mask device 1902 and to previous shadow mask devices. The voltage threshold observed for device 1900 is in agreement with values observed for standard shadow mask devices, with switching events starting to occur at around 1 and 2 V.

Figure 20:
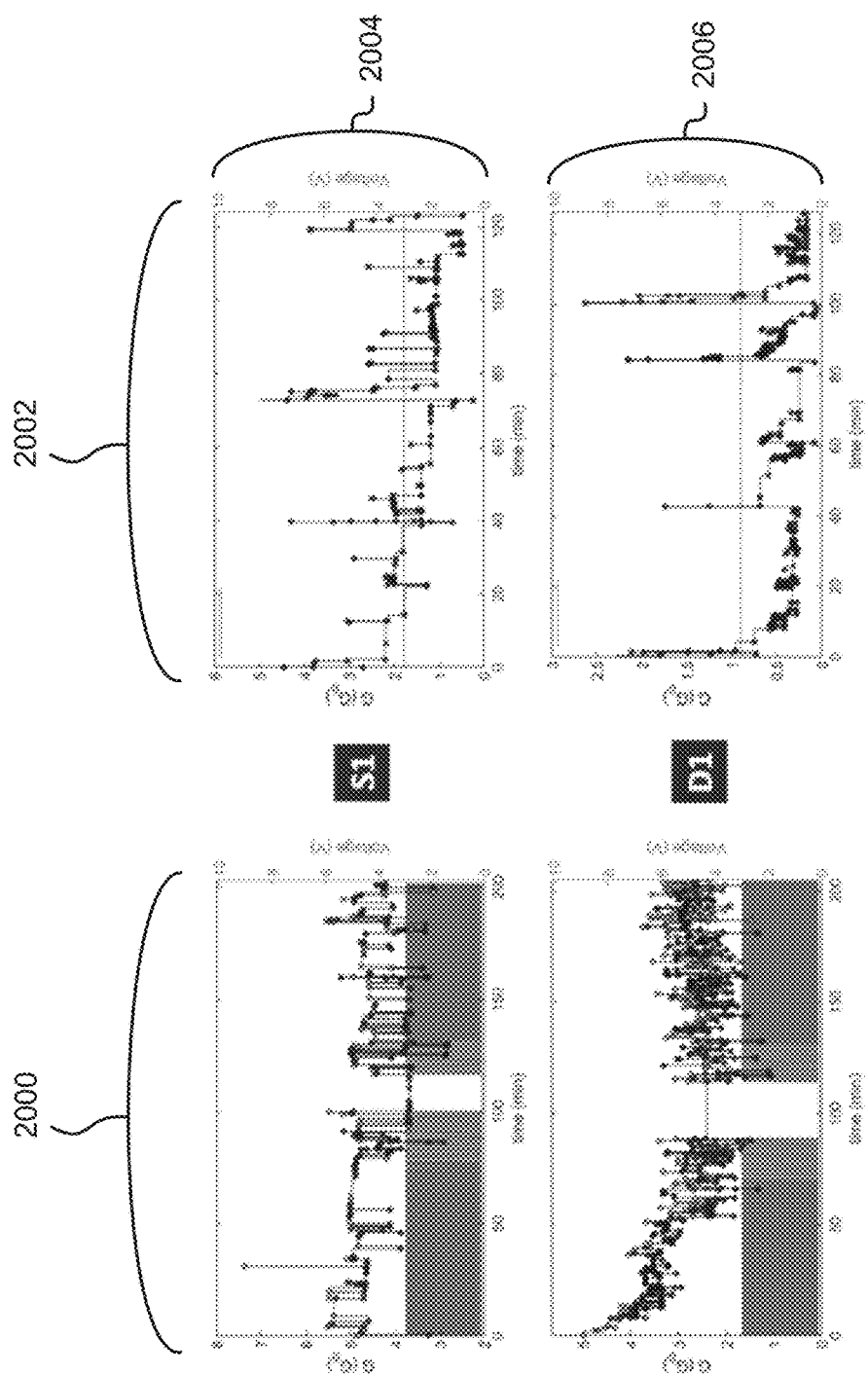
FIG. 20 shows the response of two devices to standard pulse width sequences.

FIG. 20 shows the response of the devices to standard pulse width sequences at 2000 and DC stimuli 2002. The shadow mask device 2004 and the discontinuous film device 2006 behave qualitatively very similarly to each other. In particular, the conductance of the photolithographic device 2006 actively changes throughout the measurements.

Moreover, the conductance of device 2006 does not reach very low values and the devices do not disconnect. Shadow mask devices behave similarly and are capable of sustaining high DC stimuli for several hours. On the other hand, original photolithographic devices (lacking the discontinuous film) easily fail, disconnecting at voltages that are significantly close to the threshold voltage.

Figure 21:
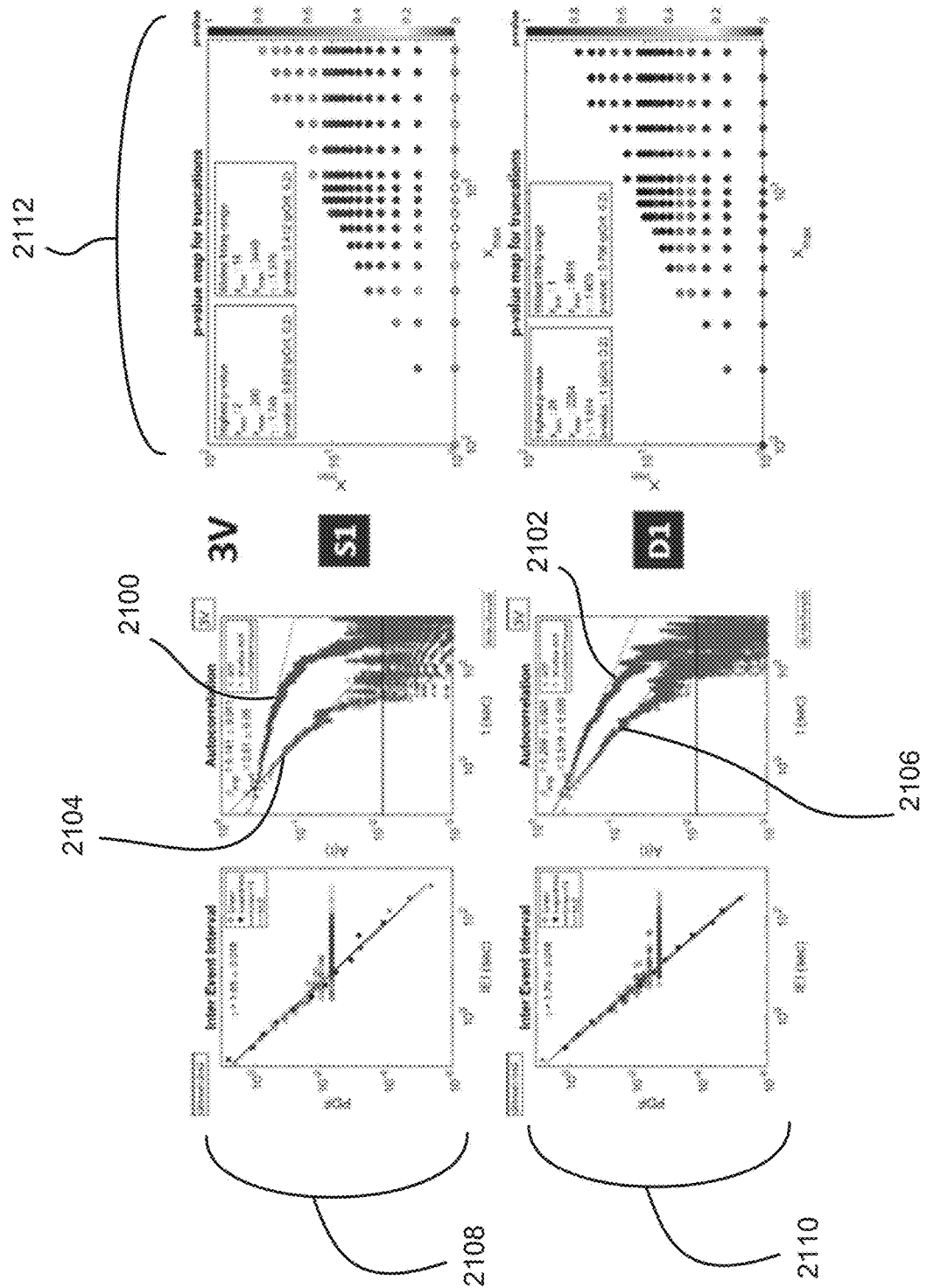
FIGS. 21, 22 and 23 show the results of investigations of device properties.

FIGS. 21. 22 and 23 show the results of detailed investigations of device properties using analysis of distributions of inter-event intervals (IEIs), autocorrelation functions (ACFs) and distributions of the sizes ($\Delta G$) of switching events. Specifically the IEI and $\Delta G$ distributions are plotted as probability density functions (PDFs).

Figure 22:
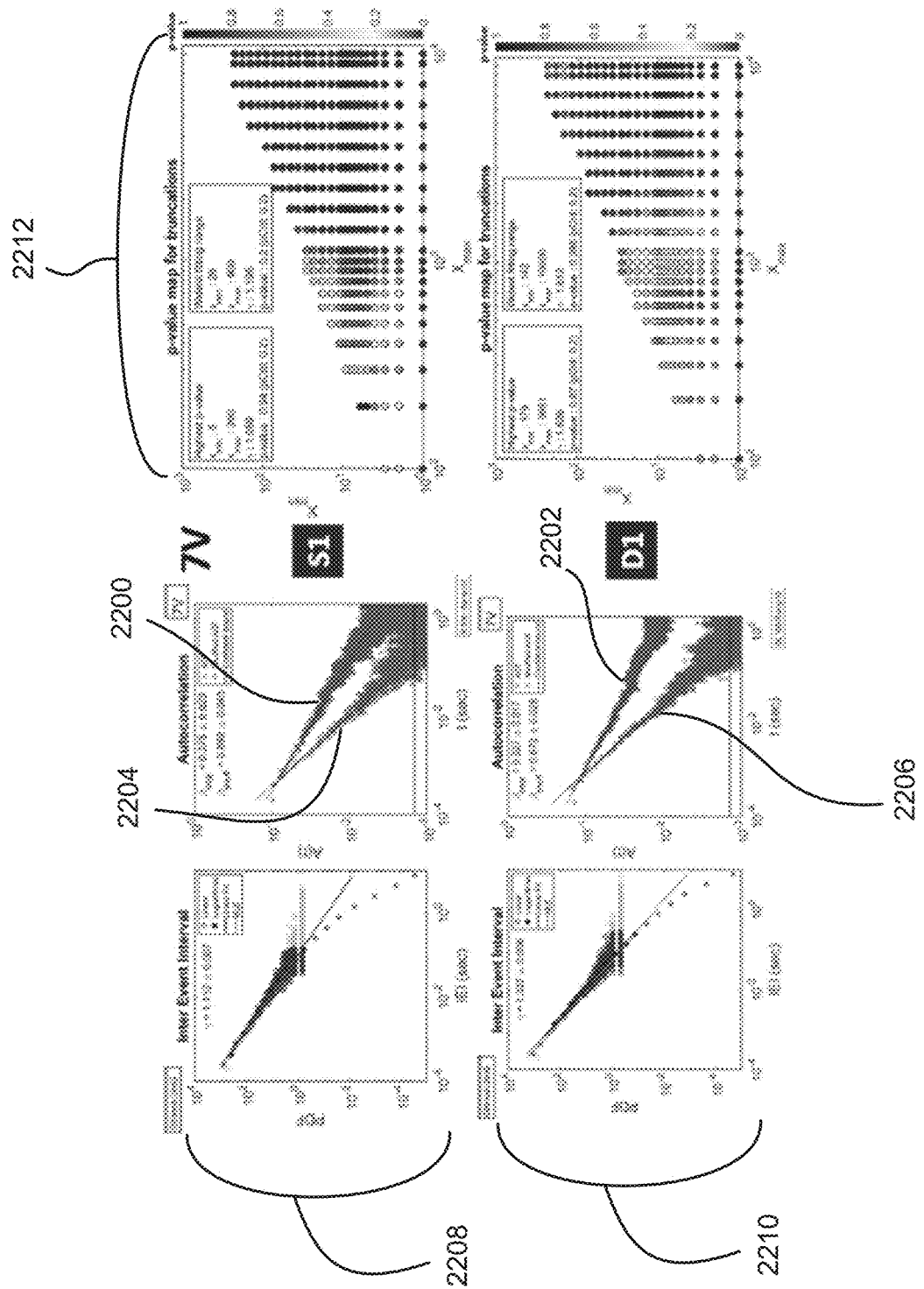

In FIG. 21 and FIG. 22, IEI distributions and ACFs for devices prepared using the improved lithographic process 2110 and 2210 are power law and consistent with the power law behaviour observed from shadow mask devices 2108 and 2208. Power law behaviour reflects correlations between events that can be used in neuromorphic computing applications. The data in FIG. 21 and FIG. 22 were obtained with 3V and 7V input voltages respectively. The measured ACFs shown at 2100, 2102, 2200 and 2202 also show power law behaviour and decays over several orders. In order to verify the ACF result, the shuffled ACF 2104, 2106, 2204 and 2206 is recalculated on a new version of the switching activity where the original IEI distribution is randomly shuffled to remove the existing correlations between the events. The slope of the shuffled ACF 2104, 2106, 2204 and 2206 significantly increases compared to the original ACF 2100, 2102, 2200 and 2202, confirming that the measured switching events are not occurring randomly but are correlated with each other.

FIG. 21 and FIG. 22 show IEI, ACF, and results of the Kolmogorov-Smirnov (KS) test for low and high DC voltage measurements, respectively. The presented results in FIG. 21 compare the shadow mask device 2108 and the photolithographic device 2110. The presented results in FIG. 22 compare the shadow mask device 2208 and the photolithographic device 2210.

At low voltage shown in FIG. 21, both the shadow mask device and the photolithographic device have IEI distributions characterised by power law behaviour. The fitting exponent for photolithographic device 2110 is slightly greater than the one found for shadow mask 2108. This difference is minimal and reflects the fact that for photolithographic device 2110 there is a slight larger number of short IEIs and smaller number of long IEIs than for shadow mask 2108. This can be affected by several factors such as the choice of threshold for event detection.

The ACF decays over two orders of magnitude for both shadow mask device 2108 and photolithographic device 2110. The fitted exponents are marginally different between the two devices, but both are much smaller than those calculated for the ACF of the shuffled events, again confirming the presence of correlation in the switching activity. At low voltage the KS test for the IEI distribution is successful over the whole dataset for photolithographic device 2110 and over three orders for shadow mask device 2108 as shown in the p-value map 2112 indicating that the power law behaviour is a robust feature of the data from all devices. Power law behaviour is a signature of the spatiotemporal correlations required for RC.

At high voltage shown in FIG. 22, the IEI distribution is power law for both photolithographic device 2210 and shadow mask device 2208. The fitted exponents are smaller than the ones calculated for the low voltage case. This is caused by higher occurrence of events which results in shorter IEIs. The high voltage data pass the KS test over three orders for photolithographic device 2210 and over two orders for shadow mask device 2208 as shown in the p-value map 2212.

The ACF decays over two orders for both shadow mask device 2208 and photolithographic device 2210. The fitted exponents are very similar for the two devices. Moreover, they are greater than the ones found at low voltages. Both devices have fitted exponents which are much smaller than the ones calculated on the ACF of the shuffled version of the switching activity.

Figure 23:
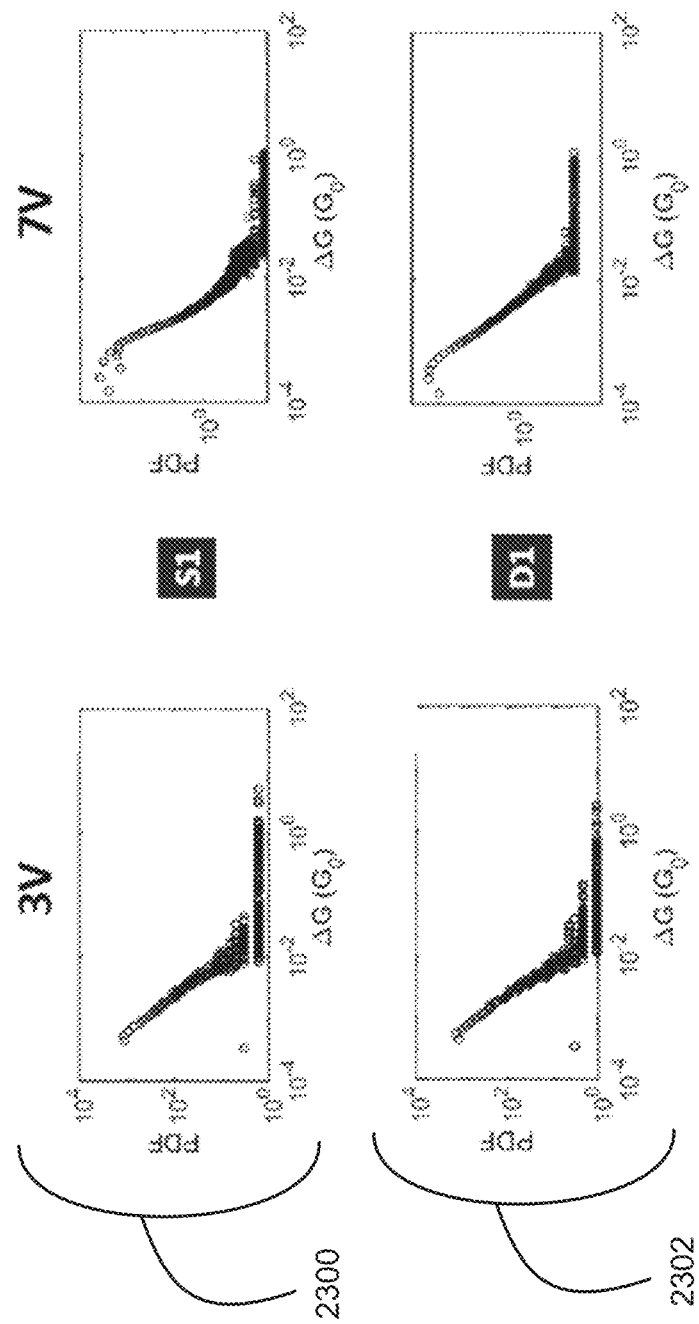

FIG. 23 shows histograms of the changes in conductance (ΔG) for many switching events for the two devices, which are qualitatively similar for the two devices at both low and high DC voltages. These results confirm that the photolithographic devices 2302 behave similarly to their shadow mask device counterparts 2300.

The foregoing description of the invention includes preferred forms thereof. Modifications may be made thereto without departing from the scope of the invention, as defined by the accompanying claims.

The invention claimed is:

1. A lithographically fabricated electrode comprising:
   a continuous metal film; and
   a discontinuous metal film having a first edge proximal to the continuous metal film, and a second edge distal the continuous metal film.

2. The electrode of claim 1 wherein the discontinuous metal film comprises a plurality of metallic objects, the metallic objects arranged so as to form gaps between at least some of the metallic objects.

3. The electrode of claim 2 wherein the metallic objects are arranged so as to form an absence of a pathway extending from the first edge to the second edge.

4. The electrode of claim 2 wherein at least some of the metallic objects are elongated, having respective widths in the range 1 to 50nm.

5. The electrode of claim 2 wherein at least some of the metallic objects are fractal and/or branched.

6. The electrode of claim 2 wherein the discontinuous metal film has a surface coverage of metallic objects in the range of 0.01 to 0.65.

7. The electrode of claim 6 wherein the discontinuous metal film has a surface coverage of metallic objects in the range of 0.05 and 0.60.

8. The electrode of claim 1 wherein the discontinuous metal film comprises gold, silver and/or copper.

9. The electrode of claim 1 wherein the discontinuous metal film has a width between the first edge of the discontinuous metal film and the second edge of the discontinuous metal film in the range 0.1 to 50 microns.

10. The electrode of claim 1 wherein the continuous metal film comprises a homogeneous metallic material.

11. The electrode of claim 1 wherein the continuous metal film comprises a plurality of discrete particles that are substantially in contact with one another.

12. The electrode of claim 1 wherein the continuous metal film and/or the discontinuous metal film is/are in contact with a substrate.

13. The electrode of claim 12 wherein the substrate comprises a silicon wafer or part thereof.

14. The electrode of claim 13 wherein the substrate is coated with an insulating oxide and/or an insulating nitride.

15. A method of fabricating an electrode comprising:
    performing a first lithography process to form a continuous metal film; and
    performing a second lithography process to form a discontinuous metal film having a first edge proximal to the continuous metal film, and a second edge distal the continuous metal film.

16. The method of claim 15 wherein forming the discontinuous metal film comprises arranging a plurality of metallic objects so as to form gaps between at least some of the metallic objects.

17. The method of claim 16 wherein forming the discontinuous metal film comprises arranging the plurality of metallic objects so as to form an absence of a pathway extending from the first edge to the second edge.

* * * * *